(12) United States Patent
Nomura et al.

(10) Patent No.: US 10,754,369 B2
(45) Date of Patent: Aug. 25, 2020

(54) REFERENCE CURRENT SOURCE AND SEMICONDUCTOR DEVICE

(71) Applicant: ROHM CO., LTD., Kyoto (JP)

(72) Inventors: Naohiro Nomura, Kyoto (JP); Takatoshi Manabe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/535,372

(22) Filed: Aug. 8, 2019

(65) Prior Publication Data
US 2020/0050231 A1   Feb. 13, 2020

(30) Foreign Application Priority Data

Aug. 10, 2018   (JP) .................. 2018-152034
Aug. 30, 2018   (JP) .................. 2018-160987
Aug. 31, 2018   (JP) .................. 2018-162933
Sep. 7, 2018    (JP) .................. 2018-167945
Jun. 28, 2019   (JP) .................. 2019-121117

(51) Int. Cl.
  *G05F 3/26*      (2006.01)
  *H03K 3/0231*    (2006.01)
  *G05F 3/24*      (2006.01)
  *H03L 7/089*     (2006.01)

(52) U.S. Cl.
  CPC .............. *G05F 3/262* (2013.01); *G05F 3/247* (2013.01); *H03K 3/0231* (2013.01); *H03L 7/0895* (2013.01)

(58) Field of Classification Search
  CPC .................. G05F 3/26; G05F 3/262

USPC ......................... 323/312, 315, 317
See application file for complete search history.

(56) References Cited

U.S. PATENT DOCUMENTS

| | | | |
|---|---|---|---|
| 6,876,182 B1* | 4/2005 | Aude ............... | G05F 3/262 323/312 |
| 7,394,306 B2* | 7/2008 | Chen ............... | G05F 1/618 323/273 |
| 2011/0193544 A1* | 8/2011 | Iacob ............... | G05F 3/242 323/315 |
| 2014/0103900 A1* | 4/2014 | Lahiri ............... | G05F 3/24 323/313 |

(Continued)

FOREIGN PATENT DOCUMENTS

| JP | 2001344028 A | 12/2001 |
|---|---|---|
| JP | 2006133869 A | 5/2006 |

*Primary Examiner* — Gary A Nash
(74) *Attorney, Agent, or Firm* — Cantor Colburn LLP

(57) ABSTRACT

A first transistor and a second transistor have control terminals coupled to each other. A current mirror circuit supplies a current having the same amount as that of a current $I_{ref}$ flowing through a first path including the second transistor to a second path including the first transistor and supplies a current having a predetermined number of times m of a current amount of the current $I_{ref}$ of the first path to a third path separate from the second path. The third transistor and a fourth transistor are provided on the third path. The third transistor has a source coupled to one end of the first transistor, and the fourth transistor has a gate coupled to a gate of the third transistor. A resistor is provided between a source of the fourth transistor and one end of the second transistor.

11 Claims, 35 Drawing Sheets

(56) References Cited

U.S. PATENT DOCUMENTS

2016/0065201 A1* 3/2016 Ishizawa .............. H03K 17/161
327/382

* cited by examiner

REFERENCE CURRENT SOURCE AND SEMICONDUCTOR DEVICE

CROSS-REFERENCE TO RELATED APPLICATION

The present application claims priority under 35 U.S.C. § 119 to Japanese Patent Application No. 2018-167945, filed on Sep. 7, 2018, Japanese Patent Application No. 2018-152034, filed on Aug. 10, 2018, Japanese Patent Application No. 2018-162933, filed on Aug. 31, 2018, Japanese Patent Application No. 2018-160987, filed on Aug. 30, 2018 and Japanese Patent Application No. 2019-121117, filed on Jun. 28, 2019, the content of which are all incorporated herein by reference.

BACKGROUND OF THE INVENTION

1. Field of the Invention

The present invention relates to a reference current source.

2. Description of the Related Art

Generally, a semiconductor integrated circuit includes a reference current source which generates a fixed reference current which does not depend on a power supply voltage or the like. The reference current is copied to be distributed as a bias current to various circuit blocks in the semiconductor integrated circuit.

FIG. 1 is a circuit diagram of a conventional reference current source 100R. The reference current source 100R includes transistors M1 to M4 and a resistance R. The transistors M1 and M2 are NMOS transistors, and the transistors M3 and M4 are PMOS transistors.

The size ratio of the transistors M1 and M2 is 1:n. The transistors M3 and M4 are current mirror circuits having a mirror ratio of 1.

An electric current flowing through the transistors M1 to M4 is identified by $I_{ref}$. When respective gate-source voltages of the transistors M1 and M2 are identified by $V_{gs1}$ and $V_{gs2}$, Formula (1) is satisfied.

$$I_{ref} = (V_{gs1} - V_{gs2})/R$$

The transistors M1 and M2 are operated in a saturation region. Formula (2) is satisfied with respect to the transistor M1, and Formula (3) satisfied with respect to the transistor M2.

$$I_{ref} = \tfrac{1}{2} \times \mu_n C_{ox} \cdot (W/L)(V_{gs1} - V_{TH})^2 \quad (2)$$

$$I_{ref} = \tfrac{1}{2} \times \mu_n C_{ox} \cdot (n \cdot W/L)(V_{gs2} - V_{TH})^2 \quad (3)$$

$\mu_n$: mobility of NMOS transistor
$C_{ox}$: capacitance per unit area
W/L: ratio of gate width to gate length
$V_{TH}$: threshold voltage It is assumed that K=W/L. Formulas (2) and (3) can be modified into Formulas (4) and (5).

$$\sqrt{(2I_{ref}/\mu_n C_{ox} K)} = V_{gs1} - V_{TH} \quad (4)$$

$$\sqrt{(2I_{ref}/\mu C_{ox} \cdot nK)} = V_{gs2} - V_{TH} \quad (5)$$

Formulas (4) and (5) are substituted into Formula (1) to rearrange Formula (1).

$$I_{ref} = \frac{V_{gs1} - V_{gs2}}{R} = \frac{1}{R}\left(\sqrt{\frac{2I_{ref}}{\mu_n C_{ox}(K)}} - \sqrt{\frac{2I_{ref}}{\mu_n C_{ox}(nK)}}\right)$$

$$I_{ref} = \frac{1}{R}\sqrt{\frac{2I_{ref}}{\mu_n C_{ox}(K)}}\left(1 - \frac{1}{\sqrt{n}}\right)$$

$$I_{ref}^2 = \frac{1}{R^2}\frac{2I_{ref}}{\mu_n C_{ox}(K)}\left(1 - \frac{1}{\sqrt{n}}\right)^2$$

From the above, the reference current is expressed by Formula (6).

$$I_{ref} = \frac{1}{R^2}\frac{2}{\mu_n C_{ox}(K)}\left(1 - \frac{1}{\sqrt{n}}\right)^2 \quad (6)$$

Japanese Patent Application (Laid Open) No. 2001-344028
Japanese Patent Application (Laid Open) No. 2006-133869

In Formula (6), the reference current $I_{ref}$ does not depend on the threshold voltage $V_{TH}$. Therefore, the variation of the resistance R, element sizes (that is, n and K), an oxide film thickness (that is, $C_{ox}$), a mobility $\mu_n$ or the like causes variations. In addition, the mobility $\mu_n$, the resistance R, and the like have temperature dependency. However, since a variable is only element sizes (n and K), it is difficult to adjust the temperature dependency (temperature characteristic) of the reference current $I_{ref}$.

SUMMARY OF THE INVENTION

The invention has been made in consideration of the problems, and a general purpose of one embodiment thereof is to provide a circuit-type reference current source different from the related art.

One embodiment of the invention relates to a reference current source. A reference current source includes: a first transistor and a second transistor having control terminals coupled to each other; a current mirror circuit structured to supply a current having the same amount as that of a current flowing through a first path including the second transistor to a second path including the first transistor and supply a current having a predetermined number of times of a current amount of the current of the first path to a third path separate from the second path; a third transistor which is provided on the third path and has a source coupled to one end of the first transistor; a fourth transistor which is provided on a low potential side from the third transistor on the third path and has a gate coupled commonly with a gate of the third transistor; and a resistance which is provided between a source of the fourth transistor and one end of the second transistor.

The third transistor and the fourth transistor may be operated in a subthreshold region.

The reference current source may further include: a fifth transistor which is provided on a low potential side from the fourth transistor on the third path. A voltage of a control terminal of the fifth transistor may be supplied to the gates of the third transistor and the fourth transistor.

The current mirror circuit includes a sixth transistor which is coupled to the first transistor, a seventh transistor which is coupled to the second transistor, and an eighth transistor which is coupled to the third path.

Another embodiment of the invention is also a reference current source. The reference current source includes: a first transistor and a second transistor having control terminals coupled to each other; a current mirror circuit structured to supply a current having the same amount as that of a current flowing through a first path including the second transistor to a second path including the first transistor and supply a current having a predetermined number of times of a current amount of the current of the first path to a third path separate from the second path; and a plurality of MOS transistors which are provided in series on the third path and have respective gates coupled commonly. One end of the first transistor is coupled to one end of one of the plurality of MOS transistors, and one end of the second transistor is coupled through a resistance with one end of another one of the plurality of MOS transistors.

The first transistor and the second transistor may be the same in size. In addition, the first transistor and the second transistor may be field effect transistors (FET). The first transistor and the second transistor may be bipolar transistors.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
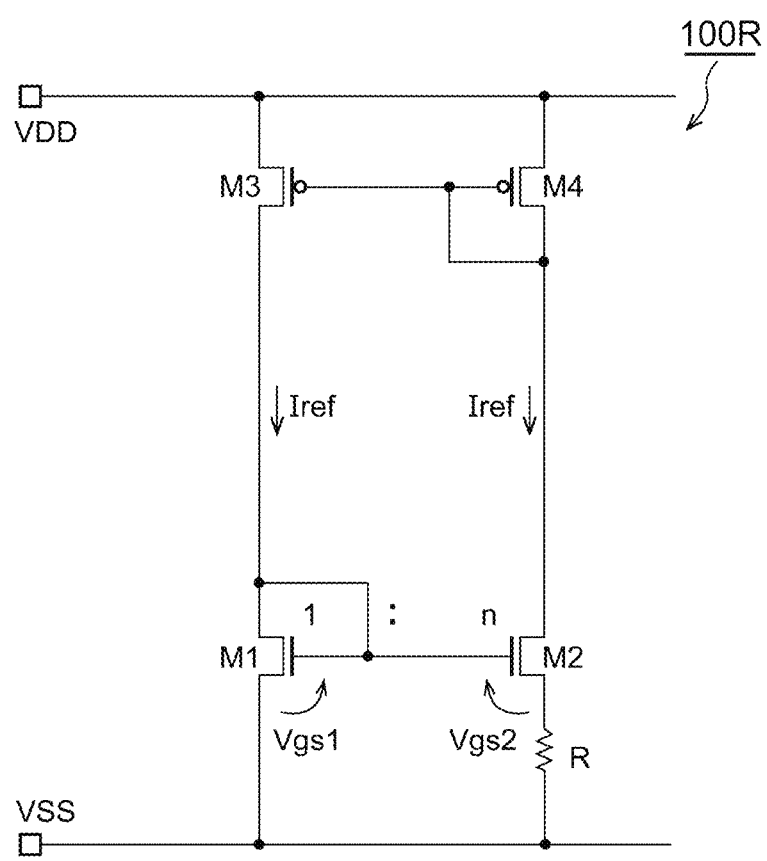
FIG. 1 is a circuit diagram of a conventional reference current source.

Hereinafter, a preferred embodiment of the invention will be described with reference to the accompanying drawings. The same or similar components, members, and processes illustrated in the drawings are denoted by the same reference numerals in all the embodiments, and redundant explanation is omitted as appropriate. In other words, in different embodiments, different members may be denoted by the same reference numeral. In addition, the embodiment does not intend to limit the invention but exemplify the invention.

All of the features described in the embodiment and the combinations thereof are not necessarily essential to the invention.

In this specification, "a state where a member A is coupled to a member B" includes a case where the member A and the member B are indirectly coupled through another member which is not affected by an electrical connection state as well as a case where the member A and the member B are directly coupled physically.

Similarly, "a state where a member C is provided between the member A and the member B" includes a case where the members are indirectly coupled through another member which is not affected by the electrical connection state as well as a case where the member A and the member C or the member B and the member C are coupled directly.

First Embodiment

Figure 2:
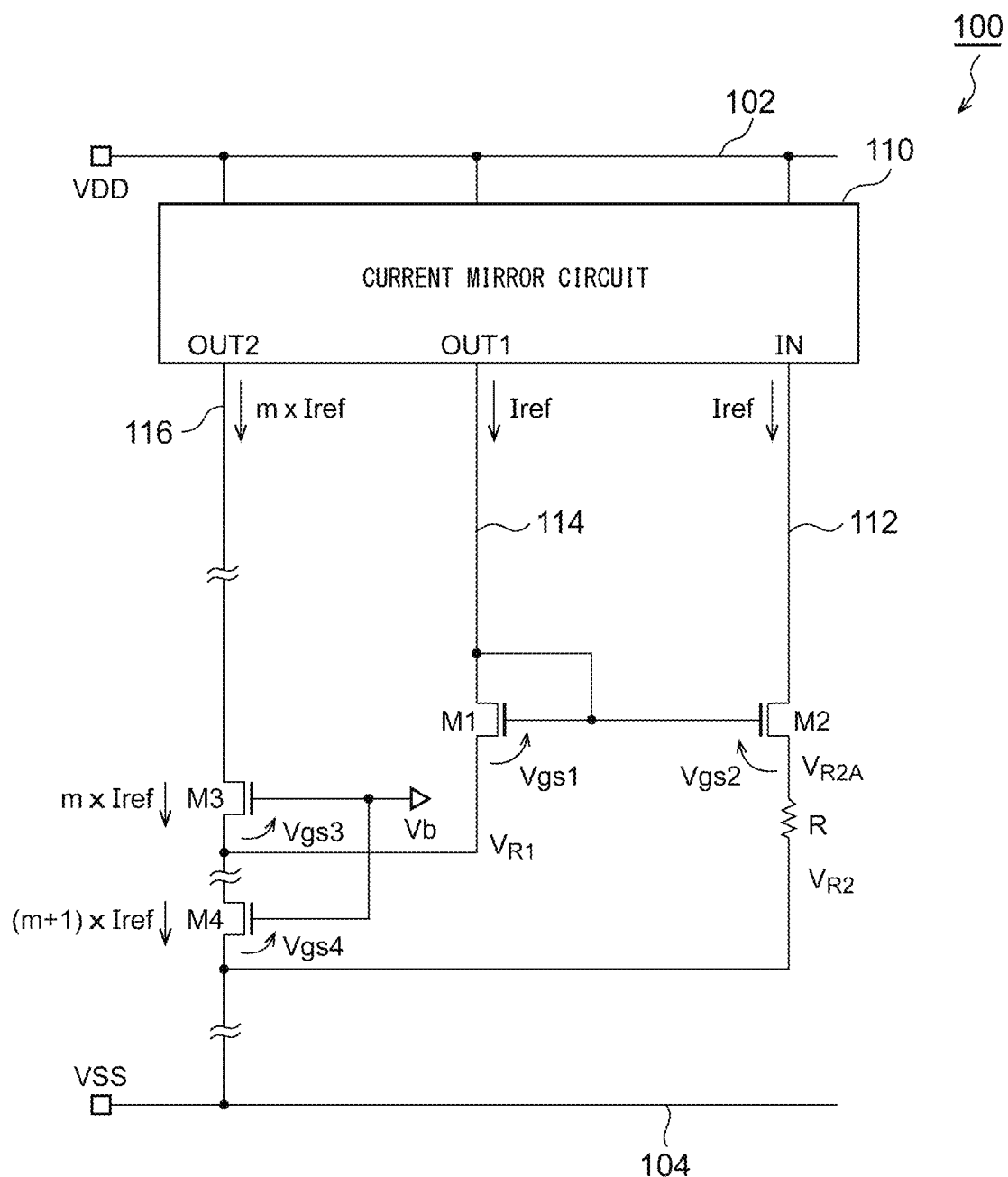
FIG. 2 is a circuit diagram of a reference current source according to a first embodiment.

FIG. 2 is a circuit diagram of a reference current source 100 according to a first embodiment. The reference current source 100 includes a first transistor M1, a second transistor M2, a third transistor M3, a fourth transistor M4, a current mirror circuit 110, and a resistance R.

The first transistor M1 and the second transistor M2 are NMOS transistors (FET), and the control terminals (that is, gates) thereof are coupled to each other. In addition, the gate and the drain of the first transistor M1 are coupled.

The current mirror circuit 110 copies a current $I_{ref}$ flowing through a first path 112 including the second transistor M2 and supplies the same amount of current to the second path 114 including the first transistor M1. In addition, the current mirror circuit 110 supplies a current $m \times I_{ref}$ obtained by multiplying the current $I_{ref}$ of the first path 112 by a predetermined coefficient (m times) to a third path 116.

The third transistor M3 is a NMOS transistor and is provided on a third path 116. A bias voltage Vb is applied to the gate of the third transistor M3, and the source is coupled to one end (source) of the first transistor M1.

The fourth transistor M4 is provided on the third path 116 on the low potential side from the third transistor M3. The bias voltage Vb is applied to the gate of the fourth transistor M4 similarly with the third transistor M3.

The resistance R is provided between the source of the fourth transistor M4 and one end (source) of the second transistor M2.

The above description has been made about the basic configuration of the reference current source 100. Subsequently, the operation thereof will be described.

The third transistor M3 and the fourth transistor M4 are configured to be operated in a subthreshold region. In the subthreshold region, a drain current $I_D$ is expressed by Formula (7).

$$I_D = K I_o \exp\left(\frac{V_{gs} - V_{TH}}{\eta V_T}\right) \quad (7)$$

$V_T$: thermal voltage (=kT/q)
η: subthreshold coefficient
k: Boltzmann constant
q: electron charge
T: absolute temperature
ρ: temperature coefficient of resistance The voltage (voltage drop) across the resistance R is obtained. The following formula is satisfied with respect to the gate-source voltages of the transistors M3 and M4.

$$V_b - V_{gs3} = V_{R1}$$

$$V_b - V_{gs4} = V_{R2}$$

In this embodiment, the transistors M1 and M2 are the same in size. Therefore, the following formula is satisfied with respect to the transistors M1 and M2.

$$V_{R1} + V_{gs1} - V_{gs2} = V_{R2A}$$

$$V_{gs1} = V_{gs2}$$

Therefore, $V_{R1} = V_{R2A}$ is satisfied

The reference current $I_{ref}$ is expressed by Formula (8).

$$I_{ref} = \frac{V_{R2A} - V_{R2}}{R} \quad (8)$$
$$= \frac{V_{R1} - V_{R2}}{R}$$
$$= \frac{(V_b - V_{gs3}) - (V_b - V_{gs4})}{R}$$
$$= \frac{V_{gs4} - V_{gs3}}{R}$$

Formula (7) is modified to obtain Formula (9).

$$\eta V_T \ln\left(\frac{I_D}{K I_0}\right) + V_{TH} = V_{gs} \quad (9)$$

Attention is focused on the third transistor M3. Since the current $m \times I_{ref}$ flows through third transistor M3, the gate-source voltage $V_{gs3}$ is given in Formula (10) by substituting $I_D = m \times I_{ref}$ into Formula (9). $K_3$ is W/L of the third transistor M3.

$$V_{gs3} = \eta V_T \ln\left(\frac{m I_{ref}}{K_3 I_0}\right) + V_{TH} \quad (10)$$

Attention is focused on the fourth transistor M4. Since the total current $(m+1) \times I_{ref}$ of the current $m \times I_{ref}$ flowing through the third transistor M3 and the current $I_{ref}$ flowing through the first transistor M1 flows through the fourth transistor M4, the gate-source voltage $V_{gs4}$ is given in Formula (11) by substituting $I_D = (m+1) \times I_{ref}$ into Formula (9). $K_4$ is W/L of the fourth transistor M4.

$$V_{gs4} = \eta V_T \ln\left(\frac{(m+1) I_{ref}}{K_4 I_0}\right) + V_{TH} \quad (11)$$

When Formulas (10) and (11) are substituted into Formula (8), the reference current $I_{ref}$ is given in Formula (12).

$$I_{ref} = \quad (12)$$

$$\frac{V_{gs4} - V_{gs3}}{R} = \frac{\eta V_T \ln\left(\frac{(m+1) I_{ref}}{K_4 I_0}\right) + V_{TH} - \left\{\eta V_T \ln\left(\frac{m I_{ref}}{K_3 I_0}\right) + V_{TH}\right\}}{R} =$$

$$\frac{1}{R} \cdot \eta V_T \left\{\ln\left(\frac{(m+1) I_{ref}}{K_4 I_0}\right) - \ln\left(\frac{m I_{ref}}{K_3 I_0}\right)\right\}$$

When Formula (12) is rearranged, the reference current $I_{ref}$ can be expressed by Formula (13).

$$I_{ref} = \frac{\eta V_T}{R} \ln\left(\frac{(m+1)K_3}{mK_4}\right) \qquad (13)$$

The temperature characteristic of the resistance R is expressed by Formula (14).

$$R = R_0 + \rho T \qquad (14)$$

$R_0$ is a resistance value when T=0.

When Formula (14) is substituted into Formula (13), Formula (15) is obtained.

$$I_{ref} = \frac{\eta kT}{q(R_0 + \rho T)} \ln\left(\frac{(m+1)K_3}{mK_4}\right) \qquad (15)$$

That is, in the reference current source 100 of FIG. 2, the reference current $I_{ref}$ can be generated corresponding to the thermal voltage $V_T$, the subthreshold coefficient, and the resistance. In this regard, the temperature characteristic of the reference current $I_{ref}$ can be controlled by adjusting the sizes $K_3$ and $K_4$ or the mirror ratio m of the third transistor M3 and the fourth transistor M4.

The invention encompasses various kinds of apparatuses and methods that can be perceived as a block diagram or a circuit diagram of FIG. 2 or that can be derived from the above-described description and is not limited to a specific configuration. Hereinafter, specific configuration examples or examples will be described so as not to be intended to restrict the scope of the invention but to ease and clarify understanding of the essence of the invention and the operation.

Example 1.1

Figure 3:
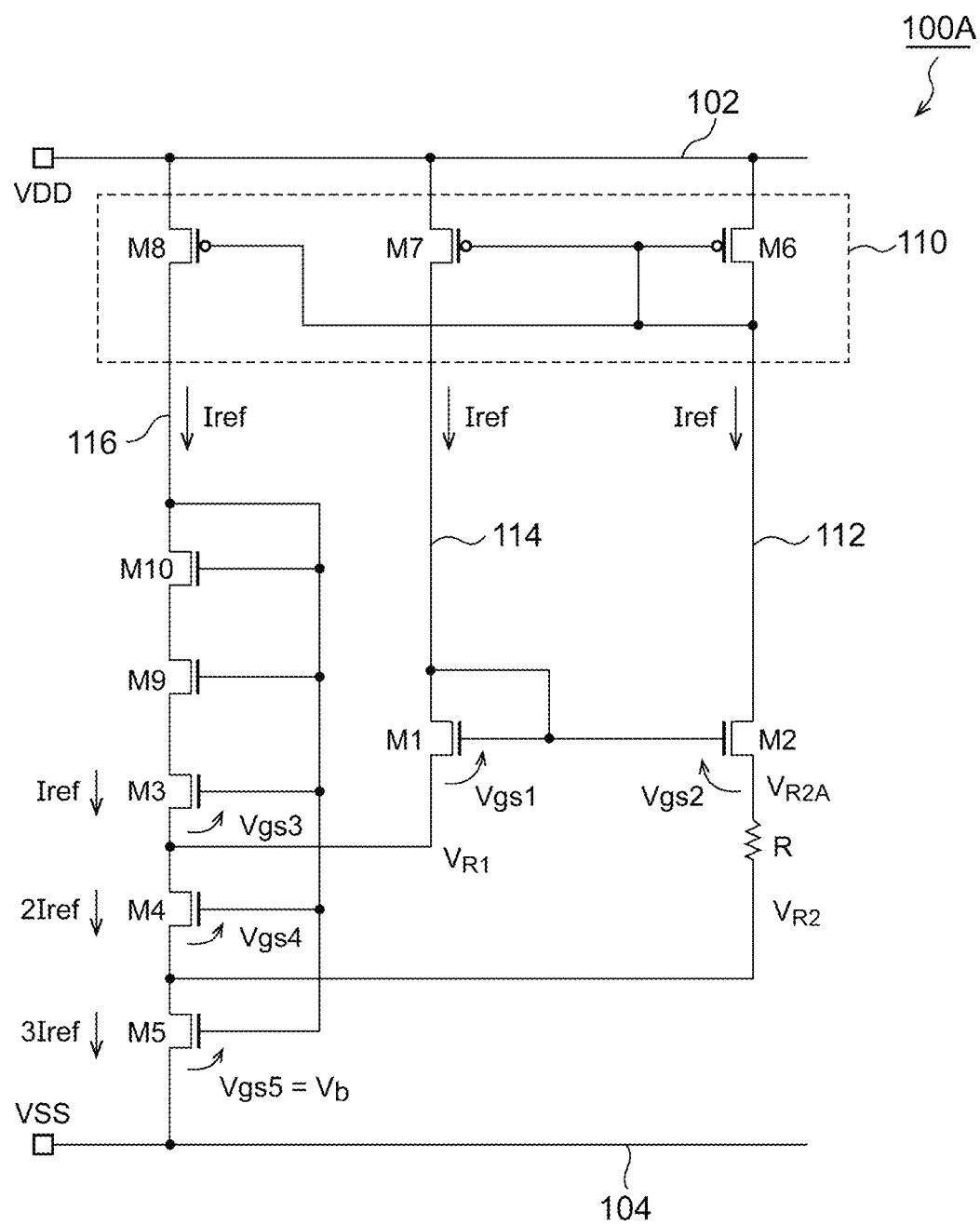
FIG. 3 is a circuit diagram of a reference current source according to Example 1.1.

FIG. 3 is a circuit diagram of a reference current source 100A according to Example 1.1. The reference current source 100A according to Example 1.1 includes a fifth transistor M5. The fifth transistor M5 is provided on the low potential side from the fourth transistor M4 on the third path 116, and one end (source) thereof is coupled to a grounding line 104. The total current $(m+2) \times I_{ref}$ of the current $(m+1) \times I_{ref}$ flowing through the fourth transistor M4 and the current $I_{ref}$ flowing through the second transistor M2 flows to the fifth transistor M5.

The voltage $V_{gs5}$ of the control terminal (that is, a gate) of the fifth transistor M5 is applied as the bias voltage $V_b$ in FIG. 2 to the gates of the transistors M3 and M4.

The current mirror circuit 110 includes a sixth transistor M6, a seventh transistor M7, and an eighth transistor M8 which are PMOS transistors. The gates of the sixth transistor M6 to the eighth transistor M8 are coupled to each other in common, and the sources thereof are coupled to the power supply line 102. In addition, the gate and the drain of the sixth transistor M6 are coupled to each other.

In Example 1.1, the mirror ratio of the current mirror circuit 110 is m=1, and the current flowing through the third path 116 is equal to the reference current $I_{ref}$.

On the third path 116, at least one PMOS transistor can be inserted to the drain side of the third transistor M3. In FIG. 3, two PMOS transistors M9 and M10 are inserted, and the bias voltage $V_b$ is applied to the gates thereof.

When the transistors M9 and M10 are inserted, and the drain of the transistor M10 is coupled to the gate of the transistor M5, the transistors M3 and M4 can be operated in the subthreshold region.

The above description has been made about the configuration of the reference current source 100A according to Example 1.1. Subsequently, the operation thereof will be described.

In Example 1.1, since m=1, the reference current $I_{ref}$ is given in Formula (16).

$$I_{ref} = \frac{\eta kT}{q(R_0 + \rho T)} \ln\left(\frac{2K_3}{K_4}\right) \qquad (16)$$

That is, in the reference current source 100A of FIG. 3, the reference current $I_{ref}$ can be generated corresponding to the thermal voltage $V_T$, the subthreshold coefficient, and the resistance R. In this regard, the temperature characteristic of the reference current $I_{ref}$ can be controlled by adjusting the sizes $K_3$ and $K_4$ of the transistors M3 and M4.

Figure 4:
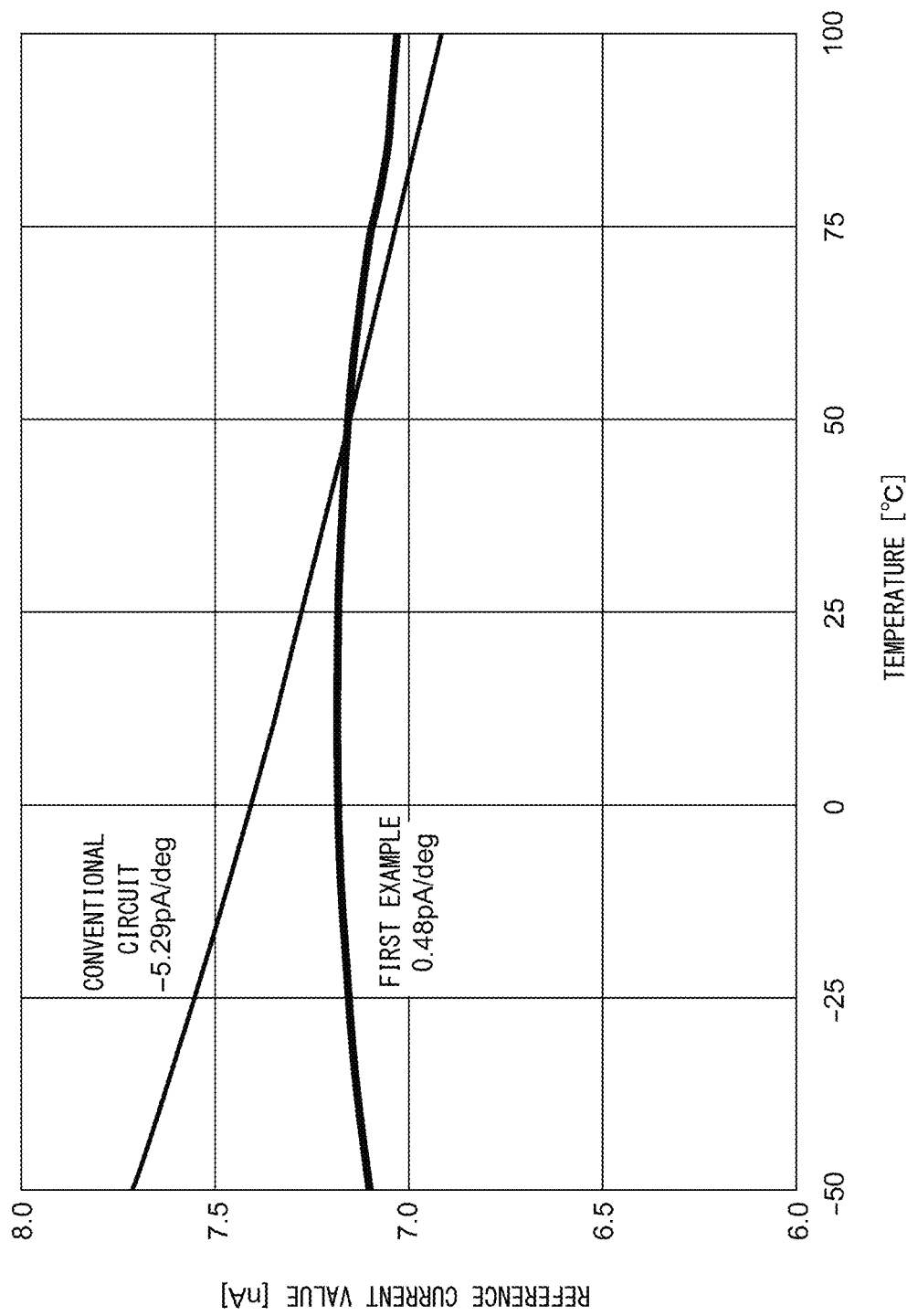
FIG. 4 is a view illustrating a temperature characteristic of the reference current source of FIG. 3.

FIG. 4 is a view illustrating the temperature characteristic of the reference current source 100A of FIG. 3. For comparison, the temperature characteristic of the reference current source 100R of FIG. 1 is also illustrated. In the related art, the reference current $I_{ref}$ monotonously decreases with respect to the temperature, and the variation of 0.8 nA occurs in the temperature range of −50° C. to 100° C. On the other hand, in this embodiment, the reference current $I_{ref}$ can be formed in an arch shape with respect to the temperature. In a case where a peak is set near a normal temperature (30° C.), a variation width in the temperature range of −50° C. to 100° C. can be suppressed to 0.2 A or less. In addition, in this embodiment, the maximum value of the temperature coefficient is 0.48 pA/deg, and the temperature coefficient can be suppressed to about one-tenth of the related art.

Figure 5A:
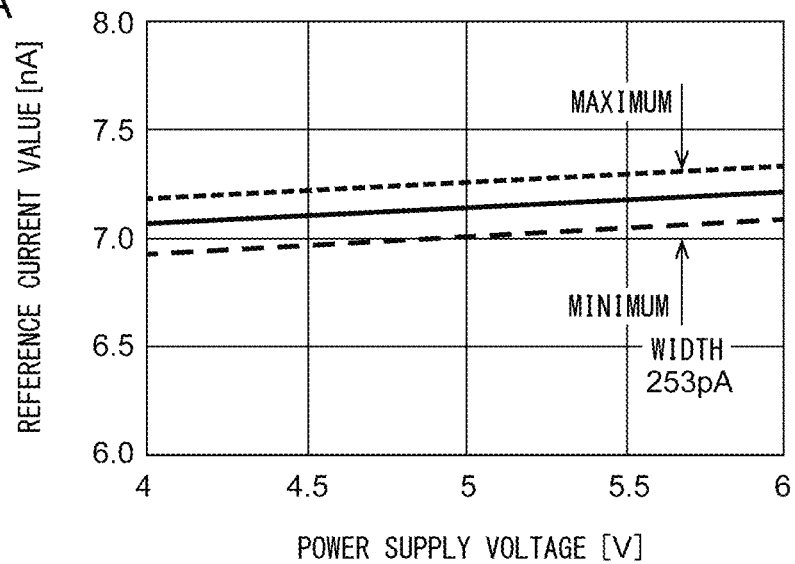
FIG. 5A and FIG. 5B are views illustrating simulation results of variations of the reference current source of FIG. 2 and the conventional reference current source.
Figure 5B:
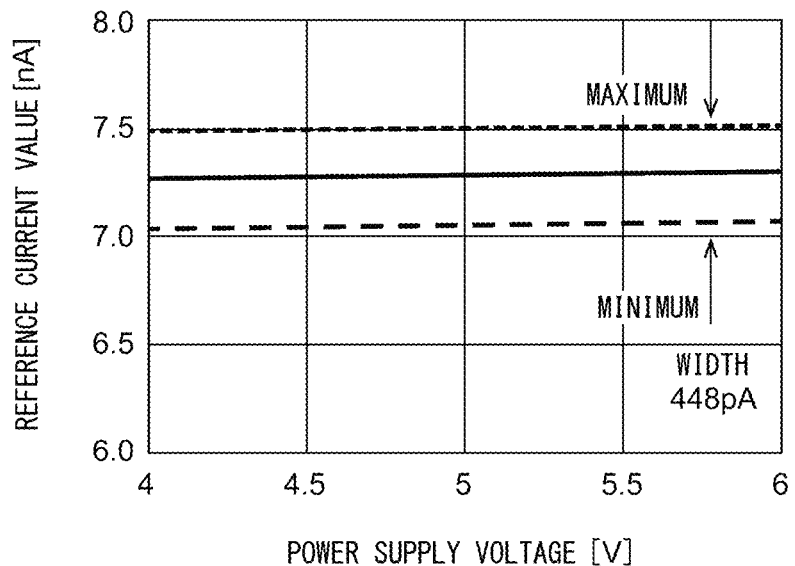

FIG. 5A is a view illustrating the simulation result of the variation of the reference current source 100A of FIG. 2. FIG. 5B illustrates the simulation result of the variation of the conventional reference current source 100R. As for the simulation, the threshold voltage $V_{TH}$, the mobility μ, and the oxide film thickness are considered.

As can be understood from a comparison between FIG. 5A and FIG. 5B, according to this embodiment, the variation can be also suppressed to about a half of the related art.

Further, in the conventional circuit of FIG. 1, in a case where the reference current $I_{ref}$ is intended to be reduced to an order of nA for power consumption reduction, the resistance value of the resistance R needs to be several MΩ On the other hand, in this embodiment, the resistance value required to generate the same amount of current can be 1 MΩ or less. This is because the voltages $V_{R2A}$ and $V_{R2}$ across both ends of the resistance R are generated by the difference between the current amounts of the transistors M6_2 and M6_3. For example, in a case where the resistance R of 5 MΩ is required in the conventional circuit, the required resistance is can be reduced to 900 kΩ in this embodiment. Thus, the element area can be reduced. Specifically, in a case where the area of 23,040 μm² is required in 5 MΩ, in 900 kΩ, the required area is shrunk to 4,320 μm² which is one-fifth of 23,040 μm².

Example 1.2

Figure 6:
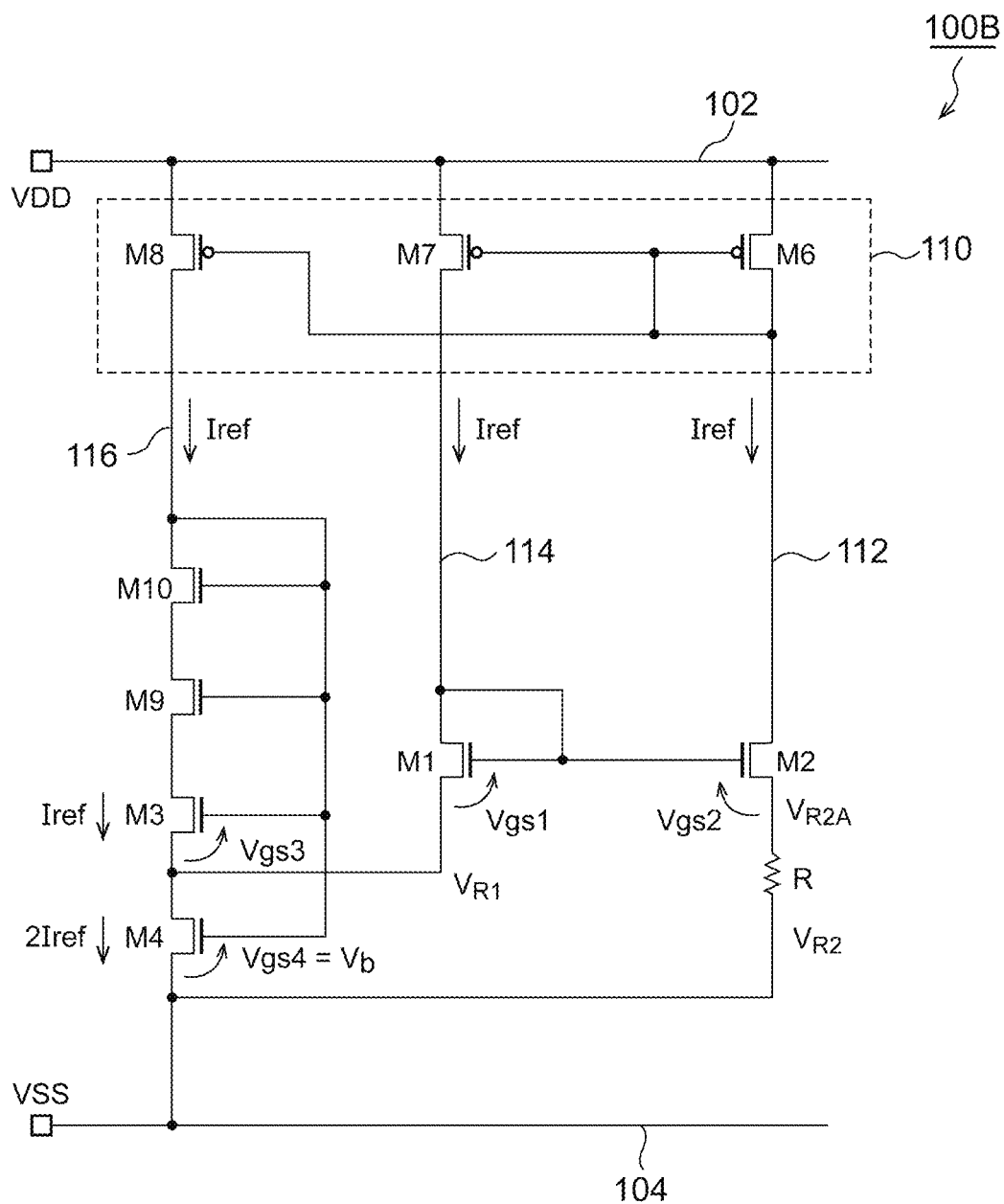
FIG. 6 is a circuit diagram of a reference current source according to Example 1.2.

FIG. 6 is a circuit diagram of a reference current source 100B according to Example 1.2. In Example 1.2, the transistor M5 of FIG. 3 is omitted, and the source of the fourth transistor M4 is coupled to the grounding line 104. That is, the gate-source voltage $V_{gs4}$ of the fourth transistor M4 corresponds to the bias voltage $V_b$.

The first embodiment has been described for exemplary purposes only. It is understood by those skilled in this art that various modifications may be made in the combination of the components and the processing processes, and such modifications are also within the range of the invention. Hereinafter, the description will be given about such modifications.

Modification 1.1

In the embodiment, the first transistor M1 and the second transistor M2 are configured as NMOS transistors. However, the invention is not limited thereto, and the first transistor M1 and the second transistor M2 may be configured as bipolar transistors. In this case, if the transistors are the same in size, the base-emitter voltages $V_{be1}$ and $V_{be2}$ become equal. Thus, Formula (8) is satisfied.

Modification 1.2

The configuration of the current mirror circuit 110 is not limited particularly. The current mirror circuit 110 may be configured as bipolar transistors. In addition, another current mirror circuit such as a wide mirror current mirror and a Wilson current mirror may be adopted.

Modification 1.3

In Example 1.1 or 1.2, the description is given in the case of m=1. However, the invention is not limited thereto. "m" may be determined randomly. As described in Formula (15), the reference current $I_{ref}$ can be controlled with "m" as a parameter. For example, the sizes of the third transistor M3 and the fourth transistor M4 are made equal ($K_3=K_4$), and the reference current $I_{ref}$ may be optimized only by "m". Otherwise, the reference current $I_{ref}$ may be optimized on the basis of both of the sizes and "m".

Modification 1.4

In the configuration of the embodiment, a circuit in which the top and the bottom are inverted by mutually replacing the N type and the P type is also included in the range of the invention.

Second Embodiment

In the second embodiment, the description is given about the activation circuit of the reference current source. The activation circuit described in the second embodiment may be combined with the reference current source 100 described in the first embodiment. However, the activation circuit may be combined with the reference current source different from that of the first embodiment.

Generally, a semiconductor integrated circuit includes a reference current source which generates a fixed reference current which does not depend on a power supply voltage or the like. The reference current is copied to be distributed as a bias current to various circuit blocks in the semiconductor integrated circuit.

The reference current source cannot be activated autonomously when the power supply voltage is turned on. Thus, it is necessary to provide an activation circuit for giving a trigger to the reference current source.

Figure 7:
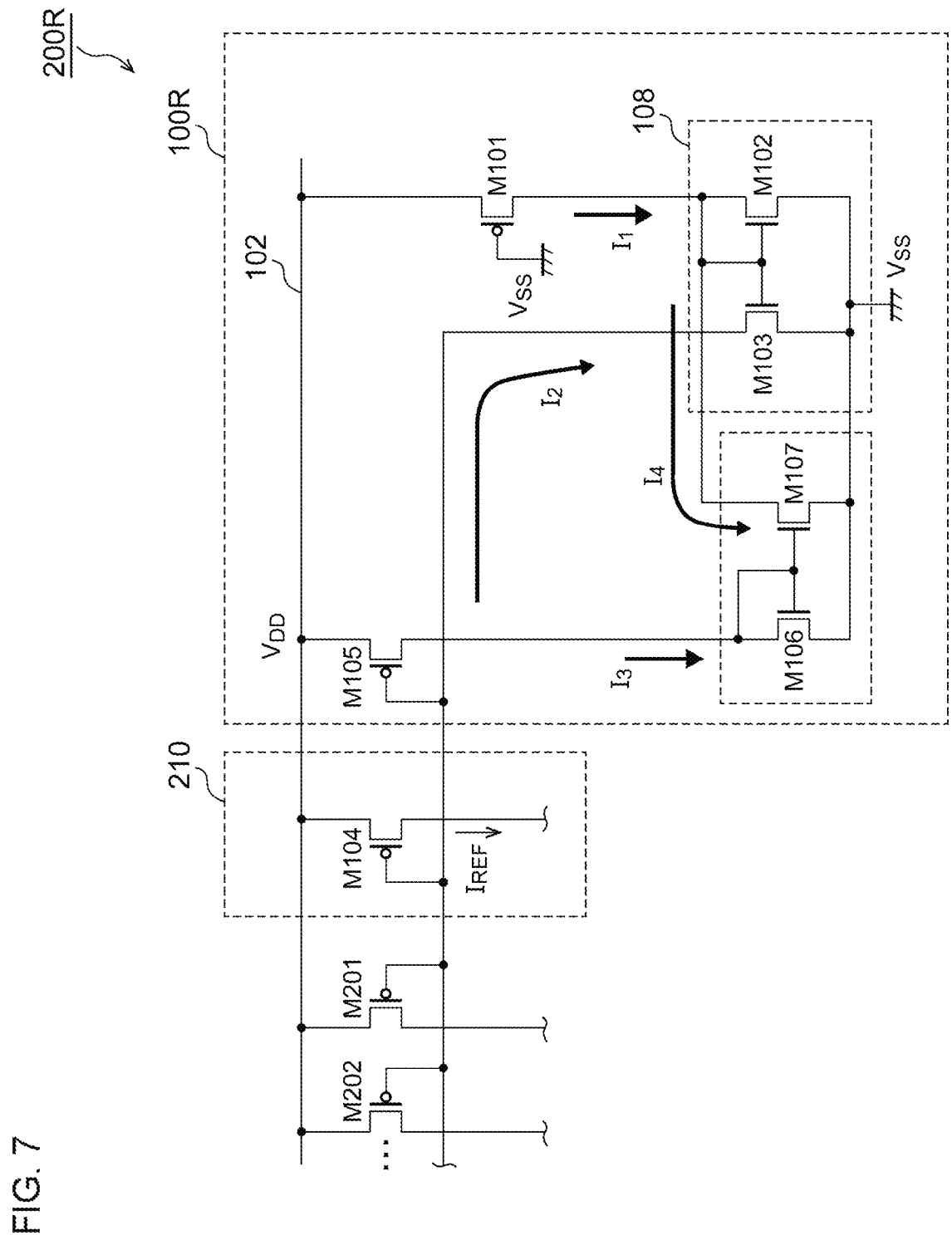
FIG. 7 is a circuit diagram of a semiconductor integrated circuit including an activation circuit examined by the inventor.

FIG. 7 is a circuit diagram of a semiconductor integrated circuit 200R which includes an activation circuit 100R examined by the inventor. The semiconductor integrated circuit 200R includes a reference current source 210 and an activation circuit 100R for giving an activation trigger to the reference current source 210.

The reference current source 210 includes a transistor M104. The transistor M104 forms the current mirror circuit together with the transistors M201, M202, and so on. After the activation of the reference current source 210 is completed, the reference current $I_{REF}$ flowing through the transistor M104 is copied to be supplied to the various circuit blocks of the semiconductor integrated circuit 200R by the transistors M201, M202, and so on.

The activation circuit 100R includes transistors M101 to M107. The activation circuit 100R gives the activation trigger to the reference current source 210 when the voltage $V_{DD}$ of the power supply line 102 increases, and the operation is stopped when the activation of the reference current source 210 is completed.

The transistor M101 is a PMOS transistor having the gate grounded. When the power supply voltage $V_{DD}$ of the power supply line 102 increases, the gate-source voltage of the transistor M101 exceeds a threshold value, the transistor M101 is turned on, and a current $I_1$ starts to flow.

The transistors M102 and M103 form the current mirror circuit 106. The transistors copy the current $I_1$ and uses an output current $I_2$ thereof to sink the currents from the transistor M104.

The transistors M105 and M104 form the current mirror circuit. The transistors copy the current $I_2$ to generate a current $I_3$. Further, the transistors M106 and M107 form the current mirror circuit. The transistors copy the current $I_3$ to generate a current $I_4$.

When the relation of $I_4>I_1$ is satisfied, all the currents flowing through the transistor M101 flow to the transistor M107 side. Thus, the input current of the current mirror circuit 108 becomes zero, the current $I_2$ also becomes zero, and the activation circuit 100R does not affect the reference current source 210.

The inventor recognizes the following problems as a result of the examination on the activation of the activation circuit 100R of FIG. 7.

In the activation circuit 100R of FIG. 7, after the activation of the reference current source 210 is completed, the current $I_2$ does not flow, but the currents $I_3$ and $I_4$ still continue to flow. In a case where the current consumption of the integrated circuit including the activation circuit 100R is an order of μA, the remaining currents $I_3$ and $I_4$ are negligible. However, in some cases, it is required to reduce the current consumption of the integrated circuit to about sub μA (for example, 100 to 200 nA), and the currents $I_3$ and $I_4$ are not negligible.

In the second embodiment, the description is given about the activation circuit in which the current consumption after completing the activation is reduced.

Figure 8:
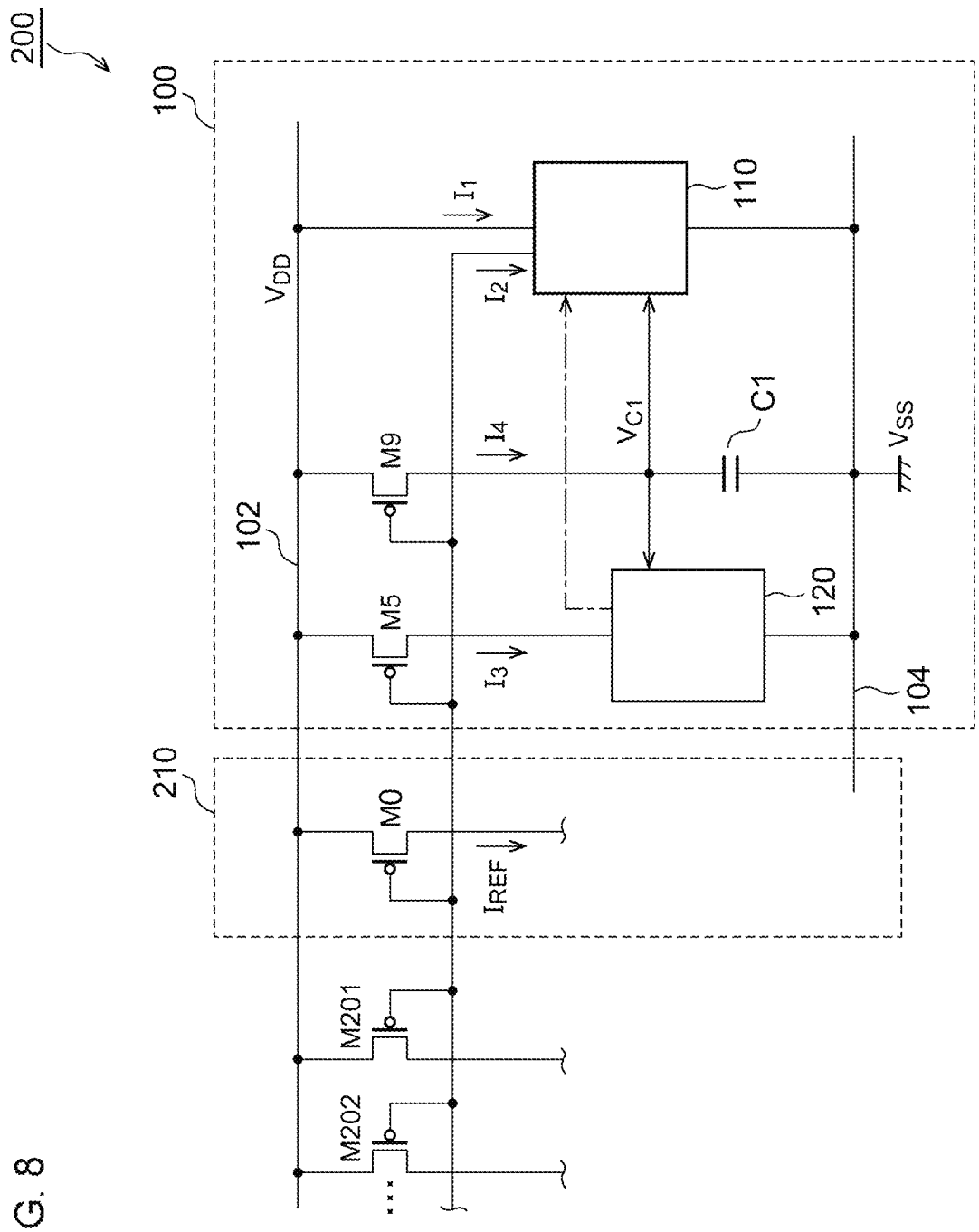
FIG. 8 is a circuit diagram of a semiconductor integrated circuit including an activation circuit according to a second embodiment.

FIG. 8 is a circuit diagram of a semiconductor integrated circuit 200 including an activation circuit 100 according to the second embodiment. The semiconductor integrated circuit 200 includes the activation circuit 100 and the reference current source 210.

The activation circuit 100 gives the activation trigger to the reference current source 210 when the power supply voltage $V_{DD}$ of the power supply line 102 increases and stops the operation when the activation of the reference current source 210 is completed.

The activation circuit 100 mainly includes a first circuit 110, a second circuit 120, a capacitor C1, and several transistors.

The first circuit 110 is provided between the power supply line 102 and the grounding line 104. The first circuit 110 is configured such that the first current $I_1$ flows from the power supply line 102 to the grounding line 104 during activation and further supplies the second current $I_2$ corresponding to the first current $I_1$ to the reference current source 210.

The reference current source 210 includes a transistor M0. In the transistor M0, the gate and the drain are coupled. The transistor M0 forms the current mirror circuit together with the transistors M201, M202, and so on and the transistors M5 and M9 of the activation circuit 100. During normal operation, the reference current $I_{REF}$ flowing through the transistor M0 flows to the transistors M201, M202, and so on, and the reference current is distributed to a plurality of circuit blocks of the semiconductor integrated circuit 200.

During the activation of the semiconductor integrated circuit 200, the second current $I_2$ flows through the transistor M0, and the second current $I_2$ is copied by the transistors M5 and M9 so that the third current $I_3$ and the fourth current $I_4$ flow therethrough.

When the third current $I_3$ corresponding to the second current $I_2$ flows, the second circuit 120 acts on the first circuit 110 such that the second current $I_2$ becomes zero. The action is illustrated by one-dot chain line in FIG. 8.

The first end of the capacitor C1 is grounded. The capacitor C1 is coupled to be charged by the fourth current $I_4$ corresponding to the second current $I_2$. When the capacitor C1 is charged by the fourth current $I_4$, the voltage $V_{C1}$ of the second end of the capacitor C1 increases.

The first circuit 110 is configured to block the first current $I_1$ flowing through the first circuit 110 when the voltage $V_{C1}$ of the capacitor C1 increases. In addition, the second circuit 120 is configured to block the third current $I_3$ flowing through the second circuit 120 when the voltage $V_{C1}$ of the capacitor C1 increases.

Figure 9:
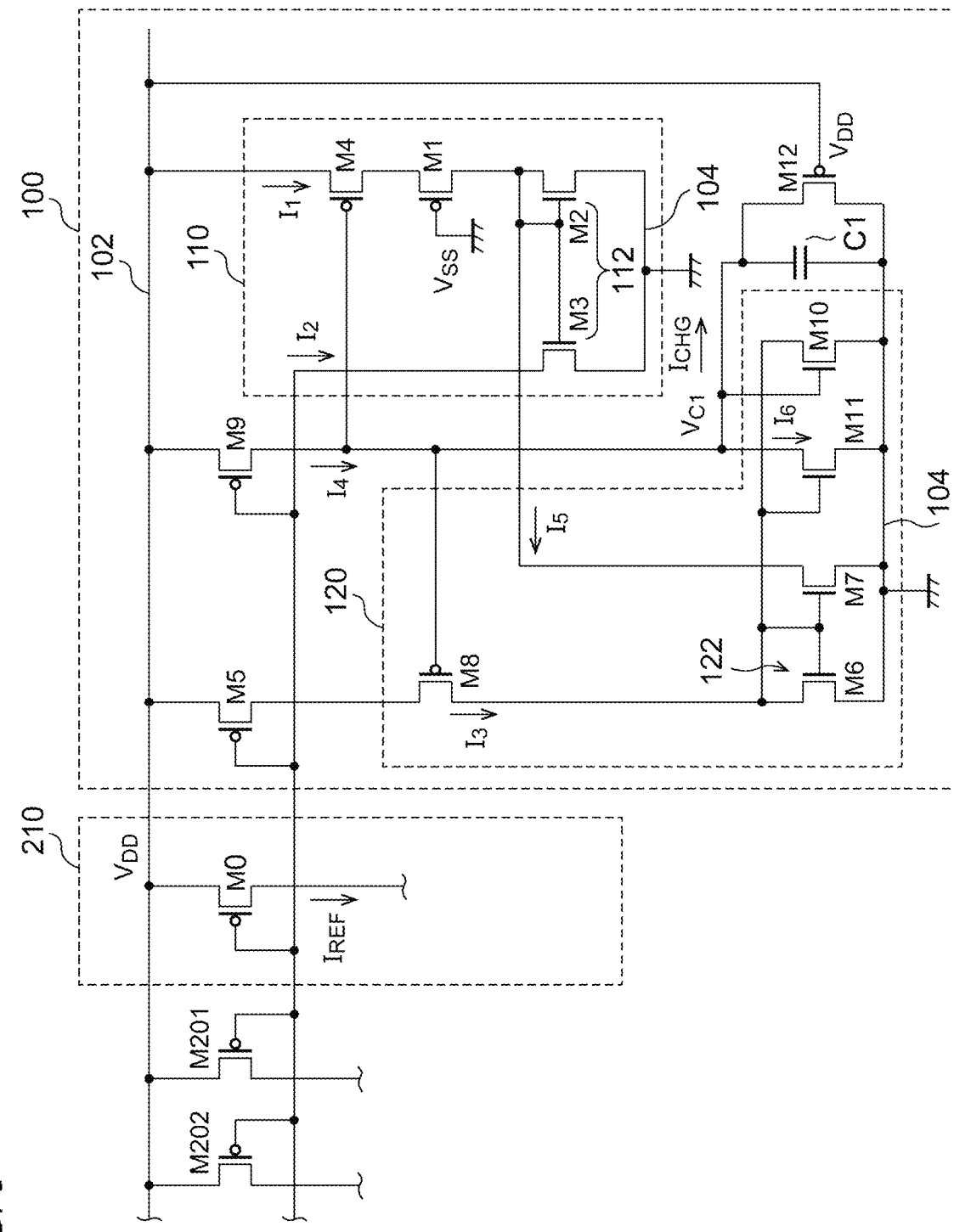
FIG. 9 is a circuit diagram illustrating a specific configuration example of the activation circuit.

The above description has been made about the basic configuration of the activation circuit 100. FIG. 9 is a circuit diagram illustrating the specific configuration example of the activation circuit 100.

The first circuit 110 includes the first transistor M1 to the fourth transistor M4. The gate of the first transistor M1 which is a PMOS transistor is grounded. The second transistor M2 is a NMOS transistor, the source is grounded, and the gate and the drain are coupled to the drain of the first transistor M1. The third transistor M3 is a NMOS transistor, the source is grounded, the gate is coupled to the gate of the second transistor M2, and the drain is coupled to the gate and the drain of the transistor M0 of the reference current source 210.

The second transistor M2 and the third transistor M3 form a first current mirror circuit 112 and copies the first current $I_1$ flowing through the first transistor M1 to generate the second current $I_2$.

In the fourth transistor M4, the source is coupled to the power supply line 102, the drain is coupled to the source of the first transistor M1, and the voltage $V_{C1}$ of the second end of the capacitor C1 is applied to the gate. The fourth transistor M4 is provided on the path of the first current $I_1$ and is a first block transistor which is turned off according to the capacitor voltage $V_{C1}$.

In the fifth transistor M5, the source is coupled to the power supply line 102, and the gate is coupled to the gate and the drain of the transistor M0 of the reference current source 210.

In a ninth transistor M9, the source is coupled to the power supply line 102, the gate is coupled to the gate and the drain of the transistor M0 of the reference current source 210, and the drain is coupled to the second end of the capacitor C1.

The second circuit 120 includes the transistors M6, M7, M10, and M11 which are NMOS transistors and the transistor M8 which is a PMOS transistor.

In the sixth transistor M6, the source is grounded, and the gate and the drain are coupled to each other. In the seventh transistor M7, the source is grounded, the gate is coupled to the gate of the sixth transistor M6, and the drain is coupled to the drain of the second transistor M2. The sixth transistor M6 and the seventh transistor M7 form the second current mirror circuit 122 which copies the third current $I_3$ to generate the fifth current $I_5$. The second current mirror circuit 122 sinks the fifth current $I_5$ from the gate of the first current mirror circuit 112. Accordingly, the second current $I_2$ is reduced, and then the second current $I_2$ becomes zero when the third transistor M3 is turned off. The fifth current $I_5$ corresponds to one-dot chain line in FIG. 8.

In the eighth transistor M8, the source is coupled to the drain of the fifth transistor M5, the drain is coupled to the drain of the sixth transistor M6, and the voltage $V_{C1}$ of the second end of the capacitor C1 is applied to the gate. The eighth transistor M8 is provided on the path of the third current $I_3$ and is a second block transistor which is turned off according to the capacitor voltage $V_{C1}$ at the gate.

In a tenth transistor M10, the source is grounded, the drain is coupled to the gate of the sixth transistor M6, and the voltage $V_{C1}$ of the second end of the capacitor C1 is applied to the gate. When the capacitor voltage $V_{C1}$ exceeds the threshold value of the tenth transistor M10, the tenth transistor M10 is turned on, the second current mirror circuit 122 including the transistors M6 and M7 is stopped, and the fifth current Is becomes zero. The tenth transistor M10 is a third block transistor which turns off the second current mirror circuit 122 according to the capacitor voltage $V_{C1}$ applied to the gate.

In an eleventh transistor M11, the source is grounded, the drain is coupled to the second end of the capacitor C1, and the gate is coupled to the gate of the sixth transistor M6. That is, the eleventh transistor M11 is a part of the second current mirror circuit 122.

The sixth current $I_6$ corresponding to the third current $I_3$ flows through the eleventh transistor M11. The sixth current $I_6$ discharges the electric charge of the capacitor C1. That is, the capacitor C1 is charged by a difference $I_{CHG}=I_4-I_6$ of the current $I_4$ flowing through the ninth transistor M9 and the current $I_6$ flowing through the eleventh transistor M11. When the voltage $V_{C1}$ of the capacitor C1 exceeds the threshold value $V_{GS(th)}$ between the gate and the source of the tenth transistor M10, the current $I_6$ becomes zero. Therefore, until the capacitor voltage $V_{C1}$ reaches the threshold value $V_{Gs(th)}$ after the capacitor C1 starts to be discharged, a charging current $I_{CHG}$ is $I_4-I_6$, and the charging capacity is limited. When the capacitor voltage $V_{C1}$ exceeds the threshold value $V_{Gs(th)}$, the charging current $I_{CHG}$ becomes $I_4$, and the limit of the charging capacity is released.

A twelfth transistor M12 is a PMOS transistor. The drain is grounded, the source is coupled to the second end of the capacitor C1, and the gate is coupled to the power supply line 102. The twelfth transistor M12 can prevent that the capacitor voltage $V_{C1}$ under a high temperature become a high level in an initial state by the leakage current of the transistor M9.

The above description has been made about the configuration of the activation circuit 100. Subsequently, the operation will be described with reference to the simulation result.

Figure 10:
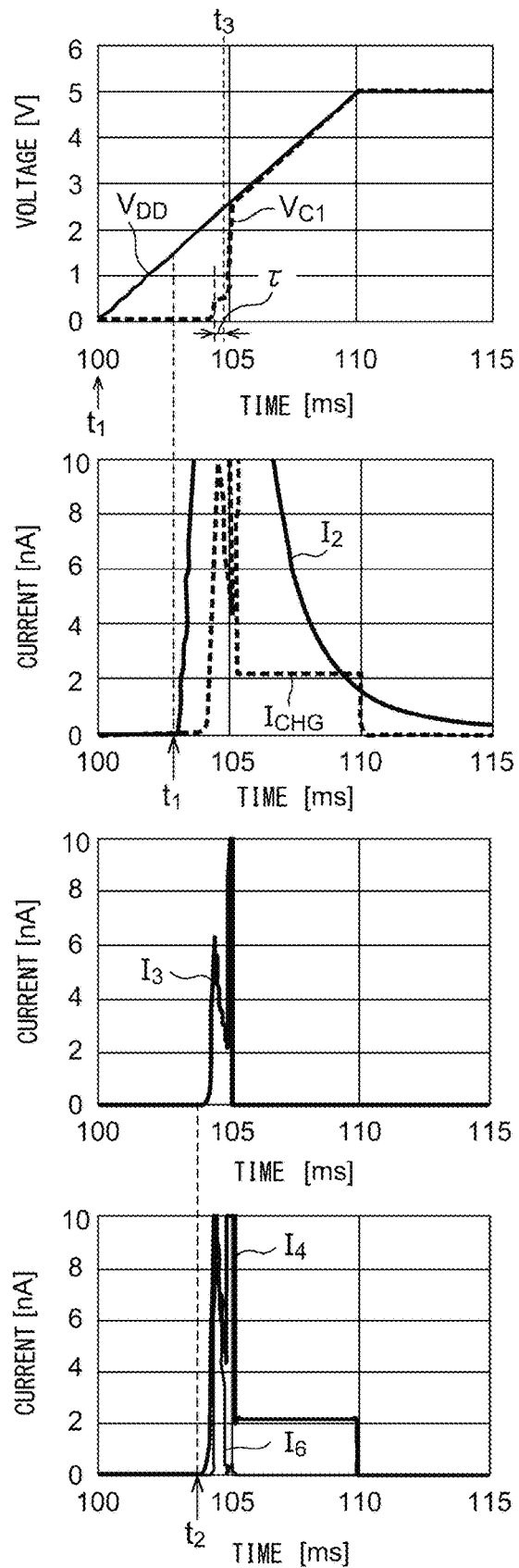
FIG. 10 is an operation waveform diagram of the activation circuit.

FIG. 10 is an operation waveform diagram of the activation circuit 100. The power supply voltage $V_{DD}$ starts to rise at time to (100 ms). When the power supply voltage $V_{DD}$ reaches a certain voltage level at time $t_1$, the first circuit 110 is activated, and the second current $I_2$ starts to flow.

The second current $I_2$ is copied by the current mirror circuit including the transistors M0 and M5, and the third current $I_3$ and the fourth current $I_4$ start to flow at time $t_2$. The third current $I_3$ is copied by the transistors M6 and M7, and the fifth current $I_5$ is extracted from the gates of the transistors M2 and M3 of the first current mirror circuit 112. Accordingly, the second current $I_2$ flowing through the reference current source 210 is reduced.

The current which is obtained by subtracting the sixth current $I_6$ from the fourth current $I_4$ is supplied as the charging current $I_{CHG}$ to the capacitor $C_1$, and the capacitor voltage $V_{C1}$ increases. In the time period τ, the charging current $I_{CHG}$ is limited by the sixth current $I_6$, and thus the increase speed of the voltage decreases.

When the capacitor voltage $V_{C1}$ exceeds the threshold value of the transistor M10 at time t3, the transistor M10 is turned on, the transistor M11 is turned off, and the current $I_6$ becomes zero. As a result, the limiter of the charging current $I_{CHG}$ is released, and the increase speed of the capacitor voltage $V_{C1}$ is increased. In addition, when the transistor M10 is turned on, the currents $I_3$, $I_5$, and $I_6$ become zero since the gate and the drain of the transistor M6 are grounded.

When the capacitor voltage $V_{C1}$ reaches the power supply voltage $V_{DD}$, the capacitor voltage $V_{C1}$ increases following the power supply voltage $V_{DD}$. Further, the transistors M1 and M8 are turned off, and the paths of the currents $I_1$ and $I_3$ are blocked.

Thereafter, when the power supply voltage $V_{DD}$ becomes constant, the charging current $I_{CHG}$ becomes zero. Then, the second current $I_2$ becomes zero, and all paths of currents become zero.

Figure 11:
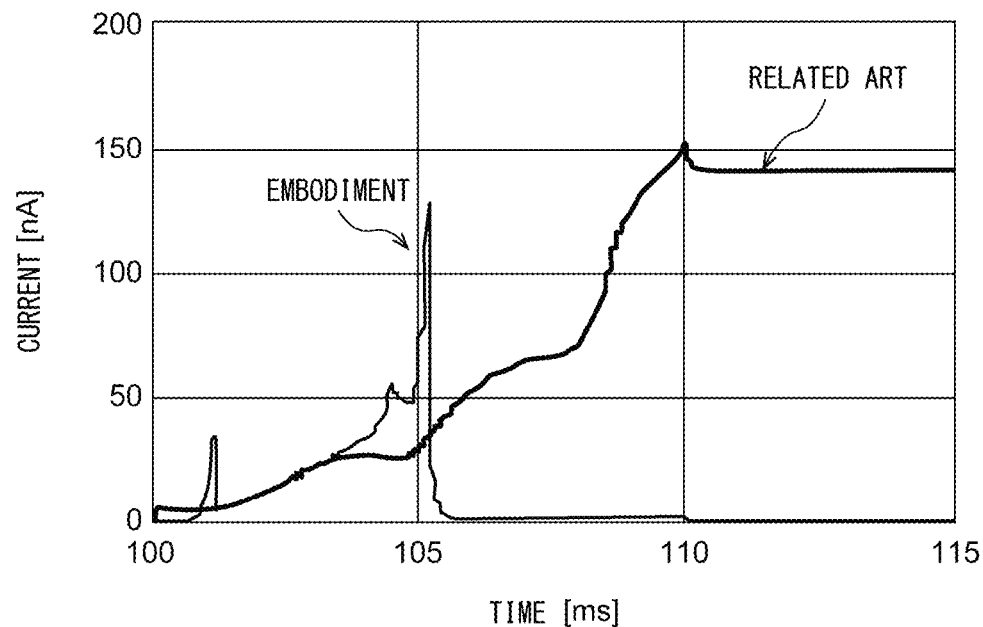
FIG. 11 is a waveform diagram of the total consumption current of the activation circuit according to the second embodiment.

FIG. 11 is a waveform diagram of the total consumption current of the activation circuit 100 according to the second embodiment. For comparison, the current consumption of the activation circuit 100R of FIG. 7 is also illustrated. In the related art, even after the activation of the circuit is completed, the current of 150 nA continues to flow regularly. On the other hand, in this second embodiment, the circuit current flows only during the activation period, and the current after completing the activation (after 110 ns) becomes substantially zero.

Figure 12:
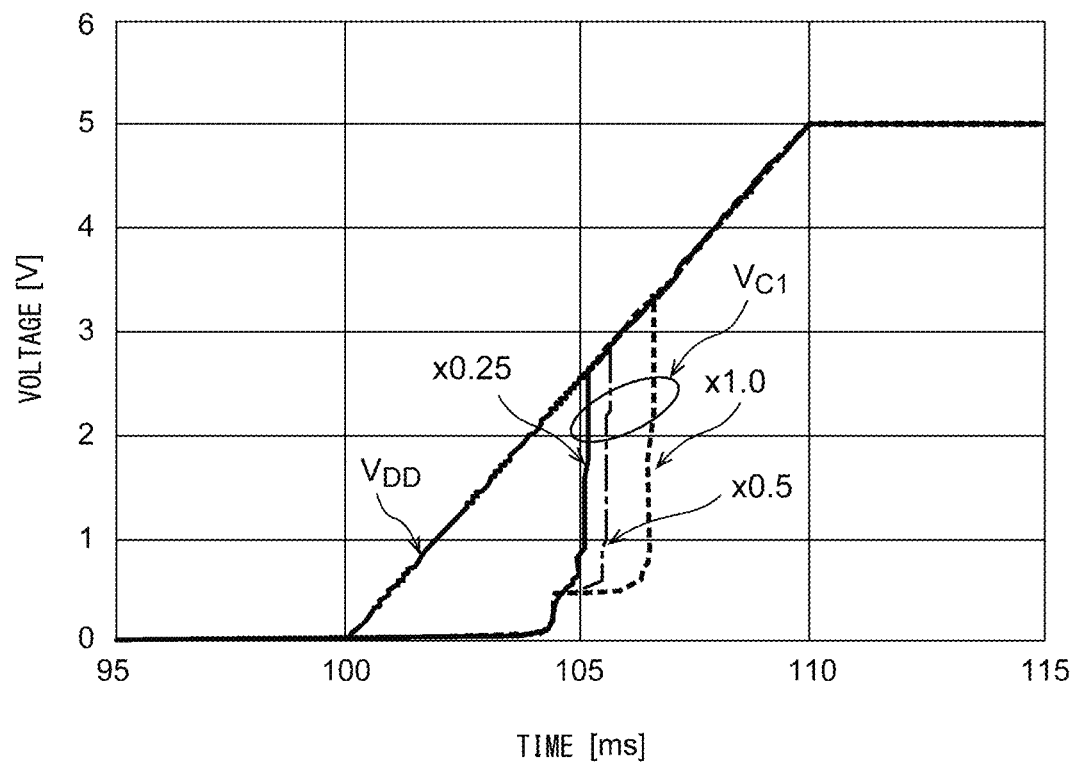
FIG. 12 is a waveform diagram of a capacitor voltage $V_{C1}$ in which the size of the transistor M11 is set as a parameter.

In the activation circuit 100 according to this second embodiment, the charging speed of the capacitor C1 can be limited by the current $I_6$. The current $I_6$ can be set according to the size of the transistor M11. FIG. 12 is a waveform diagram of the capacitor voltage $V_{C1}$ with the size of the transistor M11 as a parameter. x1.0 corresponds to M6:M11=1:2, x0.5 corresponds to M6:M11=1:1, and x0.25 corresponds to M6:M11=1:0.5. The size of the transistor M11 increases, and as the current $I_6$ increases, a delay time τ is lengthened.

Supplementary Note 2

The following technical concept is disclosed in the second embodiment.

Item 2.1

An activation circuit of a reference current source, the activation circuit including:

a first circuit which is provided between a power supply line and a grounding line and supplies a second current corresponding to a first current to the reference current source while the first current flows from the power supply line to the grounding line during activation;

a second circuit structured to act on the first circuit such that the second current becomes zero when a third current corresponding to the second current flows; and a capacitor structured to be charged by a fourth current corresponding to the second current, wherein the first circuit is configured such that the first current flowing through the first circuit is blocked when a voltage of the capacitor increases.

Item 2.2

The activation circuit according to item 2.1 wherein the first circuit is provided on a path of the first current and includes a first block transistor in which the voltage of the capacitor is applied to a gate.

Item 2.3

The activation circuit according to item 2.1 or 2.2, wherein the second circuit is configured such that the third current flowing through the second circuit is blocked when the voltage of the capacitor increases.

Item 2.4

The activation circuit according to item 2.3, wherein the second circuit is provided on a path of the third current and includes a second block transistor in which the voltage of the capacitor is applied to a gate.

Item 2.5

The activation circuit according to any one of items 2.1 to 2.4, wherein the first circuit includes a first transistor which is provided between a power supply line and a grounding line and of which a gate is biased, and a first current mirror circuit which copies the first current flowing through the first transistor to generate the second current.

Item 2.6

The activation circuit according to item 2.5, wherein the second circuit includes a second current mirror circuit which copies the third current to generate a fifth current, and the fifth current is sunk from the first current mirror circuit.

Item 2.7

The activation circuit according to item 2.6, further including:

a third block transistor in which the voltage of the capacitor is applied to a gate and which is coupled to a gate of the second current mirror circuit.

Item 2.8

The activation circuit according to item 2.6 or 2.7, wherein the second current mirror circuit limits a charging operation to the capacitor by a sixth current proportional to the third current.

Item 2.9

An activation circuit of a reference current source, the activation circuit including:

a capacitor having a first end grounded;

a first transistor having a gate grounded;

a second transistor having a source grounded and a gate and a drain coupled to a drain of the first transistor;

a third transistor having a source grounded, a gate coupled to the gate of the second transistor, and a drain coupled to a gate and a drain of a transistor of the reference current source;

a fourth transistor which has a source coupled to a power supply line and a drain coupled to the source of the first transistor and in which a voltage of a second end of the capacitor is applied to a gate;

a fifth transistor having a source coupled to the power supply line and a gate coupled to the gate and the drain of the transistor of the reference current source;

a sixth transistor having a source grounded and a gate and a drain coupled to each other;

a seventh transistor having a source grounded, a gate coupled to the gate of the sixth transistor, and a drain coupled to the drain of the second transistor;

an eighth transistor which has a source coupled to the drain of the fifth transistor and a drain coupled to the drain of the sixth transistor and in which the voltage of the second end of the capacitor is applied to a gate; and a ninth transistor having a source coupled to the power supply line, a gate coupled to the gate and the drain of the transistor of the reference current source, and a drain coupled to the second end of the capacitor.

Item 2.10

The activation circuit according to item 2.9, the circuit further including:

a tenth transistor which has a source grounded and a drain coupled to the gate of the sixth transistor and in which the voltage of the second end of the capacitor is applied to a gate.

Item 2.11

The activation circuit according to item 2.9 or 2.10, the circuit further including:

an eleventh transistor having a source grounded, a drain coupled to the second end of the capacitor, and a gate coupled to the gate of the sixth transistor.

Item 2.12

The activation circuit according to any one of items 2.9 to 2.11, the circuit further including:

a twelfth transistor having a drain grounded, a source coupled to the second end of the capacitor, and a gate coupled to the power supply line.

Item 2.13

A semiconductor integrated circuit including:

a reference current source; and the activation circuit according to any one of items 2.1 to 2.12.

Third Embodiment

In a third embodiment, the description is given about an operational amplifier.

In recent years, the power supply voltage supplied to the operational amplifier has been decreasing due to the request to reduce the power consumption of electronic equipment. In the low voltage application, the Rail-To-Rail operation is necessary to widen the range of the input voltage of the operational amplifier.

Figure 13:
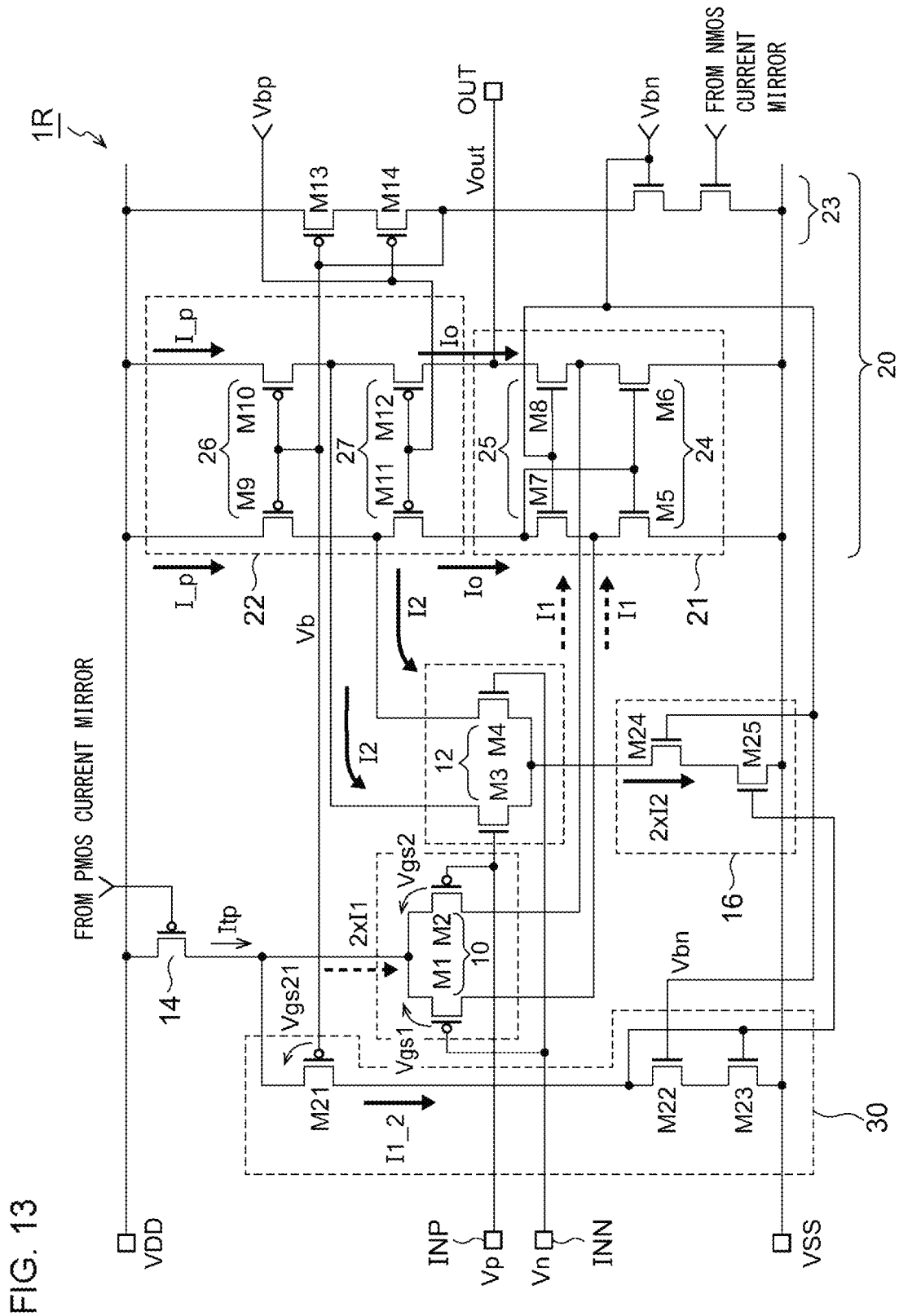
FIG. 13 is a circuit diagram of a folded cascode operational amplifier of Rail-To-Rail.

FIG. 13 is a circuit diagram of a folded cascode operational amplifier 1R of Rail-To-Rail. The operational amplifier 1R amplifies the difference between two voltages input to differential input terminals INP and INN and outputs from an output terminal OUT. The operational amplifier 1R mainly includes a first input differential pair 10, a second input differential pair 12, a first tail current source 14, a second tail current source 16, an output stage 20, and a switching circuit 30.

The first input differential pair 10 includes the first transistor M1 and the second transistor M2 which are PMOS transistors of a first polarity. The tail current source 14 includes a PMOS transistor biased as appropriate and supplies a tail current Itp to the first input differential pair 10.

The second input differential pair 12 includes the third transistor M3 and the fourth transistor M4 which are NMOS transistors of a second polarity. The tail current source 16 supplies a tail current Itn to the second input differential pair 12.

The output stage 20 converts the differential current flowing through the first input differential pair 10 and the differential current flowing through the second input differential pair 12 into an output voltage Vout. The output stage 20 includes a lower circuit 21, an upper circuit 22, and a bias circuit 23.

The lower circuit 21 includes a constant current circuit 24 (M5 and M6) which turns the differential current of the first input differential pair 10 and a gate grounding circuit 25 which is provided on the path of the turned differential current. The gate grounding circuit 25 is a pair of the NMOS transistors M7 and M8 of which the gates are biased. The upper circuit 22 includes a constant current circuit 26 (M9 and M10) which turns the differential current of the second input differential pair 12 and a gate grounding circuit 27 which is provided on the path of the turned differential current. The gate grounding circuit 27 is a pair of the PMOS transistors M11 and M12 of which the gates are biased.

The switching circuit 30 switches the first input differential pair 10 and the second input differential pair 12 according to the common-mode components (common-mode input voltage VCM) of input voltages Vp and Vn. The switching circuit 30 includes a transistor M21 which is a PMOS transistor. The source of the transistor M21 is coupled commonly with the sources of the first transistor M1 and the second transistor M2, and the bias voltage Vb is applied to the gate thereof by the output stage 20.

Among Vgs1 and Vgs2, the voltage of the higher one is expressed as Vgs. In a state where the common-mode input voltage VCM is sufficiently low compared to the bias voltage Vb (Vgs21<Vgs), all the tail currents Itp generated by the tail current source 14 flow to the first input differential pair 10 side (2×I1=Itp), and the currents do not flow through the transistor M21 (I1_2=0).

When the common-mode input voltage VCM increases to about the bias voltage Vb, that is, Vgs21≈Vgs, the current I1_2 starts to flow through the transistor M21. The transistors M22 and M23 of the switching circuit 30 form a current mirror together with the transistors M24 and M25 of the tail current source 16. The current I1_2 is copied to be supplied as the tail current 2×I2 to the second input differential pair 12. As the common-mode input voltage VCM comes close to the power supply voltage $V_{DD}$, in other words, Vgs is lower than Vgs21, the tail current 2×I1 supplied to the first input differential pair 10 decreases, and the tail current 2×I2 supplied to the second input differential pair 12 increases. Accordingly, the first input differential pair 10 and the second input differential pair 12 are switched according to the common-mode input voltage VCM.

The mismatch of the transistors M1 and M2, the mismatch of the transistors M3 and M4, the mismatch of the transistors M5 and M6, and the mismatch of the transistors M9 and M10 may cause the input offset voltage of the operational amplifier 1R. A method of trimming the resistance value of the resistances R1 and R2 of the lower circuit 21 is adopted to reduce the input offset voltage.

Figure 14:
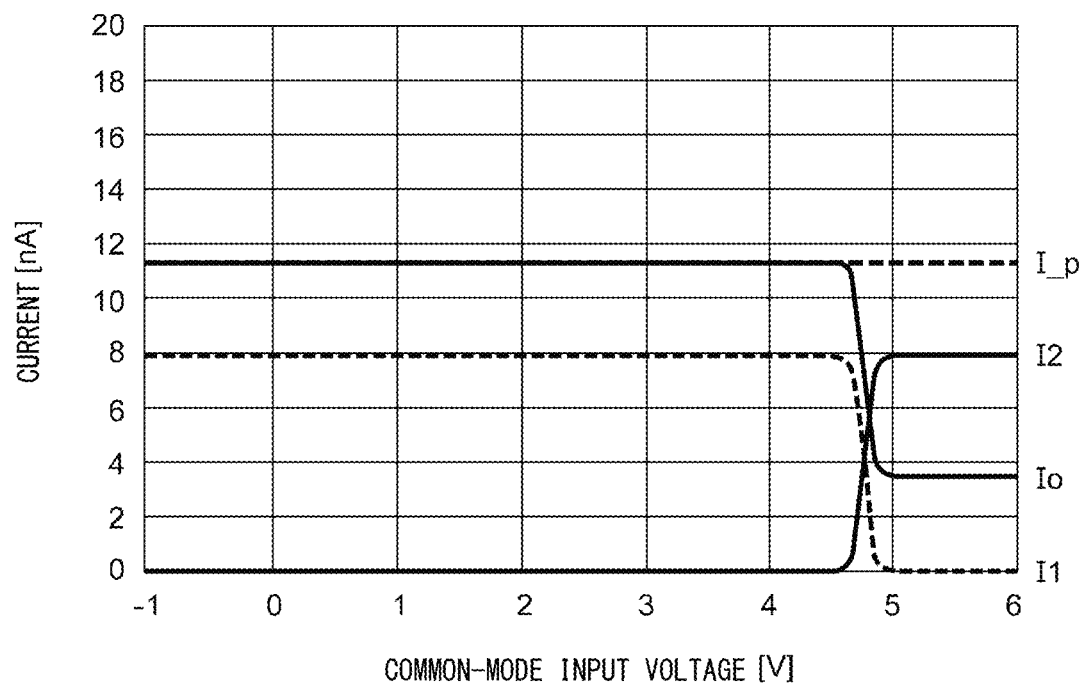
FIG. 14 is a view illustrating a relation between a common-mode input voltage and an internal current of an operational amplifier.

The inventor recognizes the following problems as a result of the examination on the operational amplifier 1R of FIG. 13. Attention is focused on the current (hereinafter, referred to as a cascode current) Io flowing through the gate grounding circuits 25 and 27 of the output stage 20. In the following examination, in order to ease the understanding and simplify the description, attention is focused only on the common-mode component, and a differential component is set to zero. FIG. 14 is a view illustrating a relation of the common-mode input voltage and the internal current of the operational amplifier 1R.

The operation of the operational amplifier 1R can be considered as being divided into a low-voltage region in which the operation of the first input differential pair 10 is dominant, a high-voltage region in which the operation of the second input differential pair 12 is dominant, and a transition region in which both input differential pairs are operated. In the drawings, the current in the low-voltage region is indicated by a broken line, and the current in the high-voltage region is indicated by a solid line.

Low-Voltage Region

The second constant current circuit 26 is biased by the bias circuit 23 such that a constant current I_p flows. The current of the second tail current source 16 is zero, and all the currents of the third transistor M3 and the fourth transistor M4 are zero. Therefore, the cascode current Io is equal to the constant current I_p.

High-Voltage Region

In the high-voltage region, the tail current 2×I2 is supplied to the second input differential pair 12 by the second tail current source 16. The current $I_2$ flows to each of the third transistor M3 and the fourth transistor M4. Therefore, the cascode current Io is reduced by I2 from I_p.

Figure 15A:
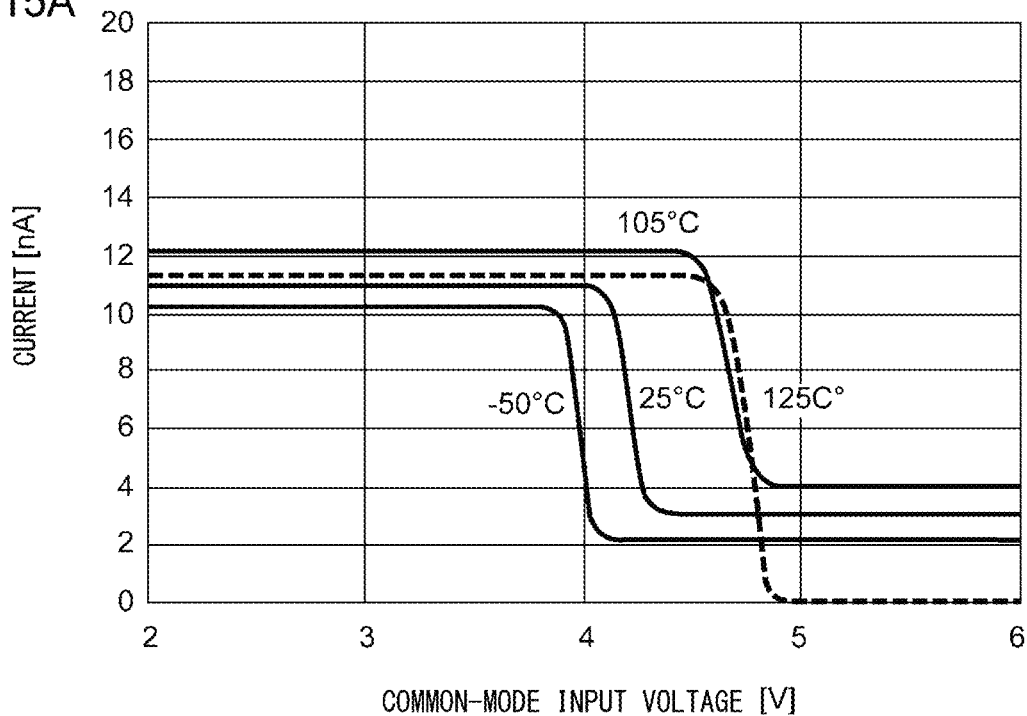
FIG. 15A and FIG. 15B are views illustrating a temperature characteristic of the operational amplifier of FIG. 13.
Figure 15B:
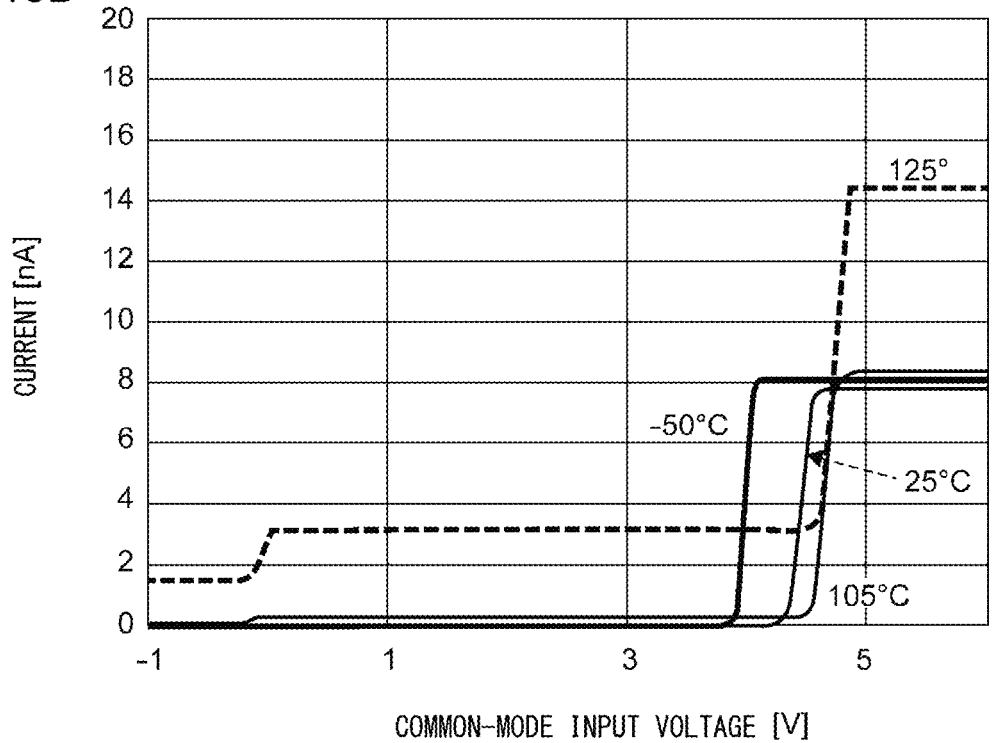

The reduction of the cascode current does not result in much problem in the operational amplifier causing large current consumption. However, a large adverse effect occurs in the operational amplifier in which all the current consumption is an order of several hundred nA. FIG. 15A illustrates a temperature dependency of the cascode current, and FIG. 15B illustrates a temperature dependency of the leakage current of the first input differential pair 10.

As the temperature becomes higher, the effect of the leakage current of the transistor becomes larger. As illustrated in FIG. 15B, in the high-voltage region, the current flowing through the second input differential pair 12 increases as the temperature rises. As a result, in the high-voltage region, as the temperature rises, the cascode current Io becomes smaller to decrease close to zero in a high-temperature state (125° C.). Thus, the operational amplifier 1R cannot be operated normally.

Figure 16:
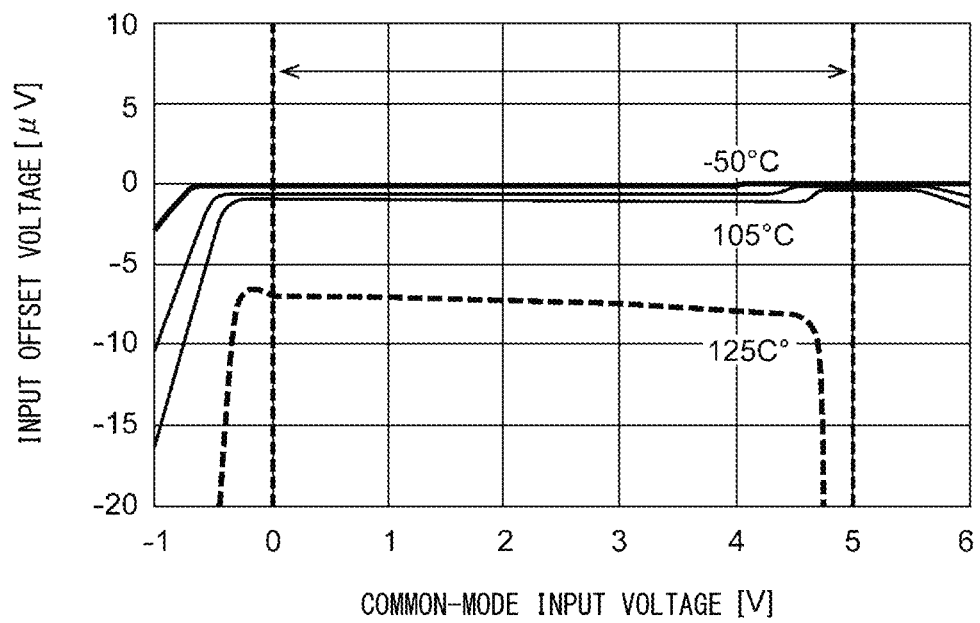
FIG. 16 is a view illustrating a relation between an input offset voltage of the operational amplifier of FIG. 13 and a common-mode input voltage.

FIG. 16 is a view illustrating a relation between the input offset voltage of the operational amplifier 1R and the common-mode input voltage. In a range of −50° C. to 105° C., the input offset voltage is kept near zero in the common-mode input range of 0 to 5 V. However, the input offset voltage increases at 125° C., and the operation is disabled particularly in the range of 4.8 V to 5 V.

In the third embodiment, the description will be given about the operational amplifier in which a normal operation can be performed in a wide voltage range.

Figure 17:
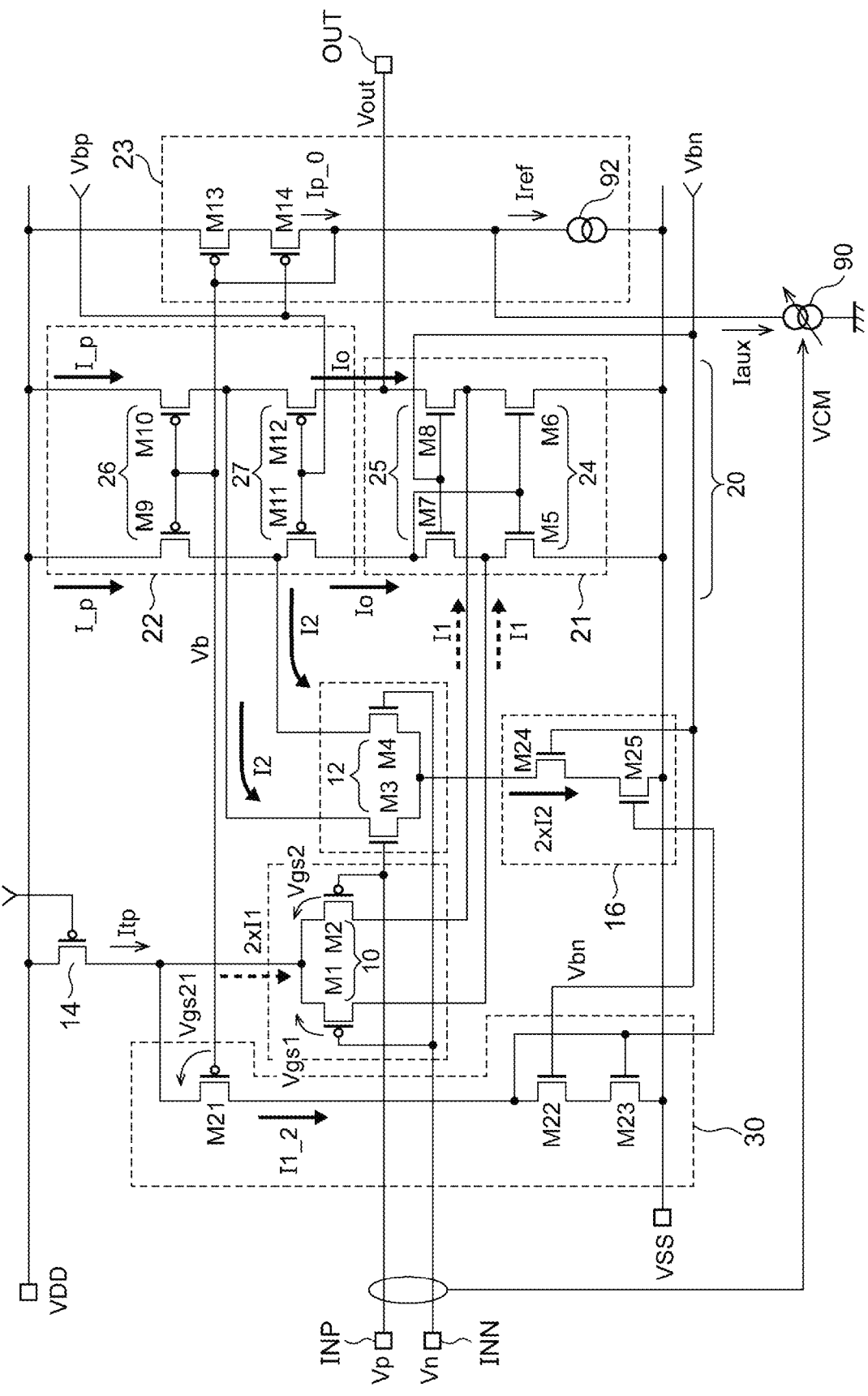
FIG. 17 is a circuit diagram of an operational amplifier according to a third embodiment.

FIG. 17 is a circuit diagram of the operational amplifier 1 according to the third embodiment. The operational amplifier 1 is a folded cascode type and includes the first input differential pair 10, the second input differential pair 12, the first tail current source 14, the second tail current source 16, the output stage 20, and the correction circuit 90.

The first input voltage Vp is input to the non-inverting input terminal INP, and the second input voltage Vn is input to the inverting input terminal INN. The upper the power supply voltage is input to the upper power supply terminal $V_{DD}$, and the lower power supply voltage (for example, a grounding voltage) is supplied to the lower power supply terminal (grounding terminal) VSS. The operational amplifier 1 amplifies the difference between the first input voltage Vp and the second input voltage Vn and outputs the output voltage Vout from the output terminal OUT.

The first input differential pair 10 includes the first transistor M1 and the second transistor M2 which are PMOS transistors. The gate of the first transistor M1 is coupled to the inverting input terminal INN, and the gate of the second transistor M2 is coupled to the non-inverting input terminal INP.

The second input differential pair 12 includes the third transistor M3 and the fourth transistor M4 which are NMOS transistors. The gate of the third transistor M3 is coupled to the non-inverting input terminal INP, and the gate of the fourth transistor M4 is coupled to the inverting input terminal INN.

The first tail current source 14 supplies the first tail current Itp to the first input differential pair 10. The second tail current source 16 supplies the second tail current Itn to the second input differential pair 12.

The output stage 20 includes the upper circuit 22 and the lower circuit 21 which are stacked between the power supply line $V_{DD}$ and the grounding line VSS. The lower circuit 21 is coupled to the first input differential pair 10, and the upper circuit 22 is coupled to the second input differential pair 12. The output terminal OUT is drawn from a node inside the output stage 20. In this example, the connection nodes of the upper circuit 22 and the lower circuit 21 are OUT terminals.

The output stage 20 includes the lower circuit 21 and the upper circuit 22. The lower circuit 21 includes the first constant current circuit 24 and the first gate grounding circuit 25. The first constant current circuit 24 includes the transistors M5 and M6 and turns the differential current of the first input differential pair 10. The first gate grounding circuit 25 is provided on the path of the turned differential current (referred to as a first turned differential current). The first gate grounding circuit 25 includes a pair of transistors M7 and M8 in which the bias voltage Vbn generated by a bias circuit (not illustrated) is applied to the gate. The lower circuit 21 is a cascode current mirror in which the M5 side is an input side, and the M6 side is an output side.

The upper circuit 22 functions as an active load with respect to the first turned differential current and converts the first turned differential current into the output voltage Vout. The upper circuit 22 includes the second constant current circuit 26 and the second gate grounding circuit 27. The second constant current circuit 26 includes the transistors M9 and M10 and turns the differential current of the second input differential pair 12. The second gate grounding circuit 27 includes the transistors M11 and M12 and is provided on the path of the turned differential current. The lower circuit 21 also functions as an active load with respect to a second turned differential current and converts the second turned differential current into the output voltage Vout. The bias voltage Vbp generated by the bias circuit (not illustrated) is applied to the gates of the transistors M11, M12, and M14.

The transistors M9 to M12 of the upper circuit 22 configure the cascode current mirror together with the transistors M13 and M14 of the bias circuit 23. The current I_p of the transistors M9 and M10 is proportional to the current Ip_0 flowing through the transistor M13.

The switching circuit 30 dynamically changes the first tail current 2×I1 and the second tail current 2×I2 according to the first input voltage Vp and the second input voltage Vn. Specifically, the second tail current 2×I2 is substantially zero in the above-described low-voltage region, and the first tail current 2×I1 is substantially zero in the high-voltage region. In the transition region, the switching circuit 30 may continuously change the first tail current 2×I1 and the second tail current 2×I2 according to the common-mode input voltage VCM to seamlessly connect the high-voltage range and the low-voltage region.

The first tail current source 14 generates the first tail current Itp. The switching circuit 30 sinks the current amount I1_2 corresponding to the common-mode input voltage VCM of the first input voltage Vp and the second input voltage Vn. Therefore, the amount of the tail current 2×I1 supplied to the first input differential pair 10 becomes Itp−I1_2.

The sink current I1_2 is substantially zero in the low-voltage region and may be equal to the tail current amount Itp in the high-voltage range. In addition, in the transition region, the sink current I1_2 may increase as the common-mode input voltage VCM increases.

The second tail current source 16 is coupled to the switching circuit 30 and generates the second tail current 2×I2 in conjunction with the state of the switching circuit 30, that is, the sink current I1_2. The second tail current 2×I2 is substantially zero in the low-voltage region and is a predetermined amount in the high-voltage range. In addition, in the transition region, the second tail current 2×I2 may increase as the common-mode input voltage VCM increases. Similarly to FIG. 13, the switching circuit 30 includes the transistors M21 to M23.

The correction circuit 90 corrects the current I_p flowing through the second constant current circuit 26 according to the first input voltage Vp and the second input voltage Vn. In this embodiment, the correction circuit 90 corrects the current I_p on the basis of the common-mode input voltage VCM of the first input voltage Vp and the second input voltage Vn. More specifically, compared to the low-voltage range in which the first input differential pair 10 is operated, the current I_p increases in the high-voltage range in which the second input differential pair 12 is operated.

The correction circuit 90 is configured to change the bias current Ip_0 according to the first input voltage Vp and the second input voltage Vn. For example, the bias current Ip_0 can be a combined current of a predetermined reference current $I_{ref}$ and an auxiliary current Iaux. The correction circuit 90 generates the auxiliary current Iaux corresponding to the common-mode input voltage VCM of the first input voltage Vp and the second input voltage Vn.

The above description has been made about the basic configuration of the operational amplifier 1. The invention encompasses various kinds of apparatuses and methods that can be perceived as a block diagram or a circuit diagram of FIG. 17 or that can be derived from the above-described description and is not limited to a specific configuration. Hereinafter, specific configuration examples or examples will be described so as not to be intended to restrict the scope of the invention but to ease and clarify understanding of the essence of the invention and the operation.

Example 3.1

Figure 18:
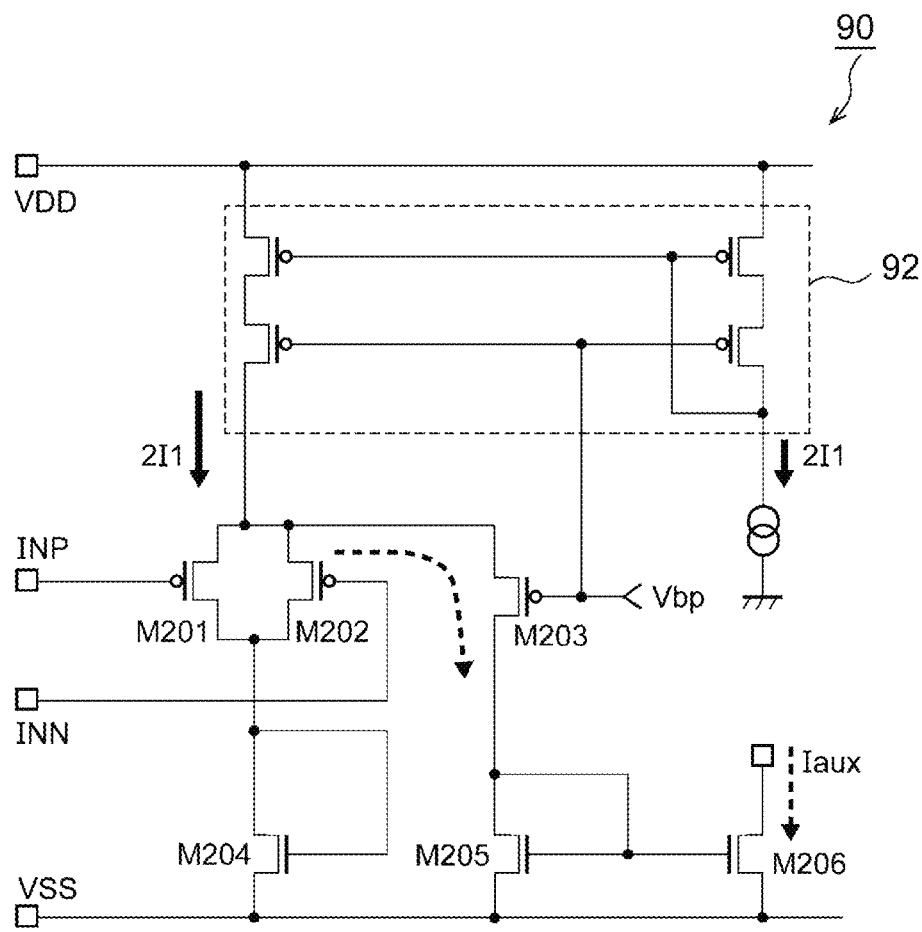
FIG. 18 is a circuit diagram of a correction circuit according to Example 3.1.

FIG. 18 is a circuit diagram of the correction circuit 90 according to Example 3.1. The correction circuit 90 includes a constant current source 92 and the transistors M201 to M206. The constant current source 92 generates a constant current 2I1. The constant current source 92 may be configured by using the technology of the reference current source described in the first embodiment or the second embodiment.

The sources of the first detection transistor M201 to the third detection transistor M203 are coupled commonly with the constant current source 92. The first input voltage Vp is input to the gate of the first detection transistor M201, the second input voltage Vn is input to the gate of the second detection transistor M202, and the bias voltage Vb is applied to the gate of the third detection transistor M203. The transistor M204 is coupled as a load to the drains of the transistors M201 and M202. The current flowing through the third detection transistor M203 is copied by the current mirrors M205 and M206 and is output as the auxiliary current Iaux. The operation of the correction circuit 90 is similar to that of the switching circuit 30. The current corresponding to the common-mode input voltage VCM flows through the transistor M203 and is copied to be the auxiliary current Iaux.

Figure 19A:
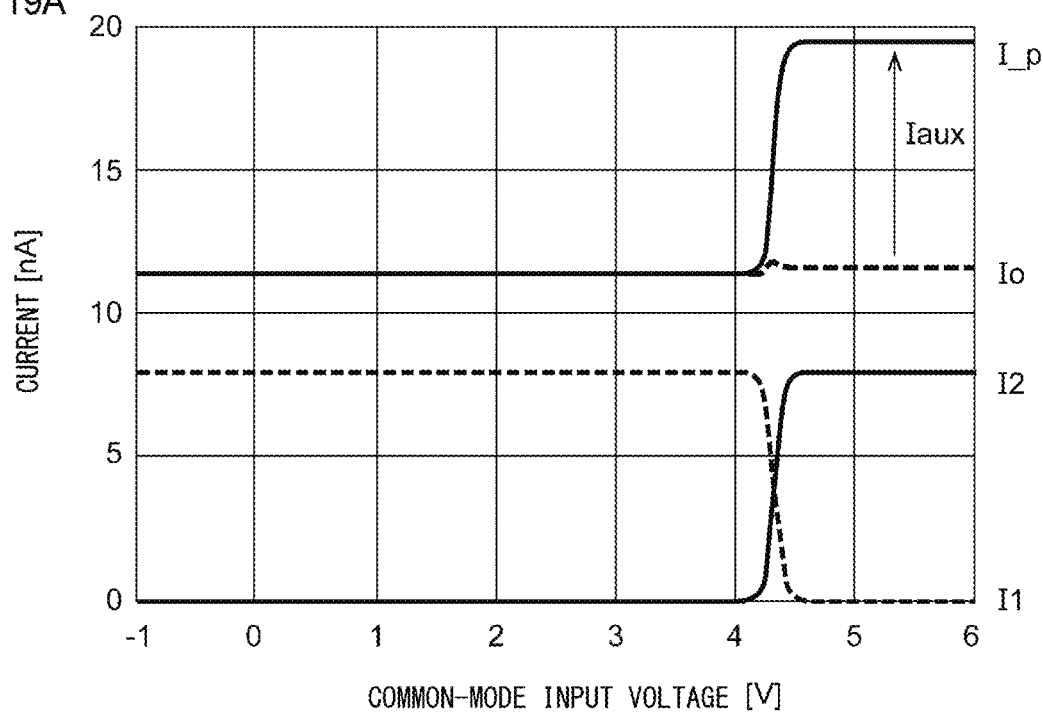
FIG. 19A and FIG. 19B are views illustrating the characteristic of the operational amplifier of FIG. 17.

Subsequently, the description will be given about the operation of the operational amplifier 1 according to Example 3.1. FIG. 19A is a view illustrating a relation between the common-mode input voltage and the internal current of the operational amplifier 1. In the high-voltage region, the current I_p flowing through the second constant current circuit 26 increases by the auxiliary current Iaux. Since the increment of the signal current corresponding to the auxiliary current Iaux offsets the current I2 of the second input differential pair 12, the cascode current Io is constant in the whole voltage range.

Figure 19B:
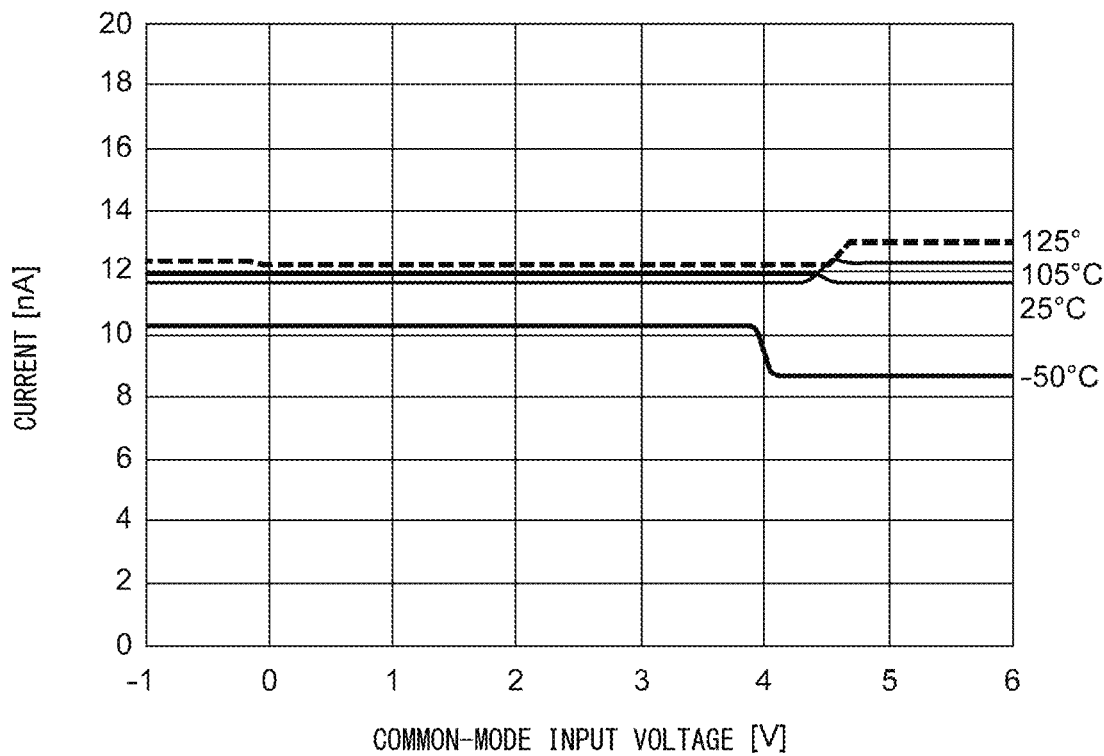

FIG. 19B is a view illustrating a relation between the common-mode input voltage and the cascode current. In 0 to 5 V of the common-mode input range, it is found that the cascode current Io is kept in a normal range in the wide temperature range.

Figure 20:
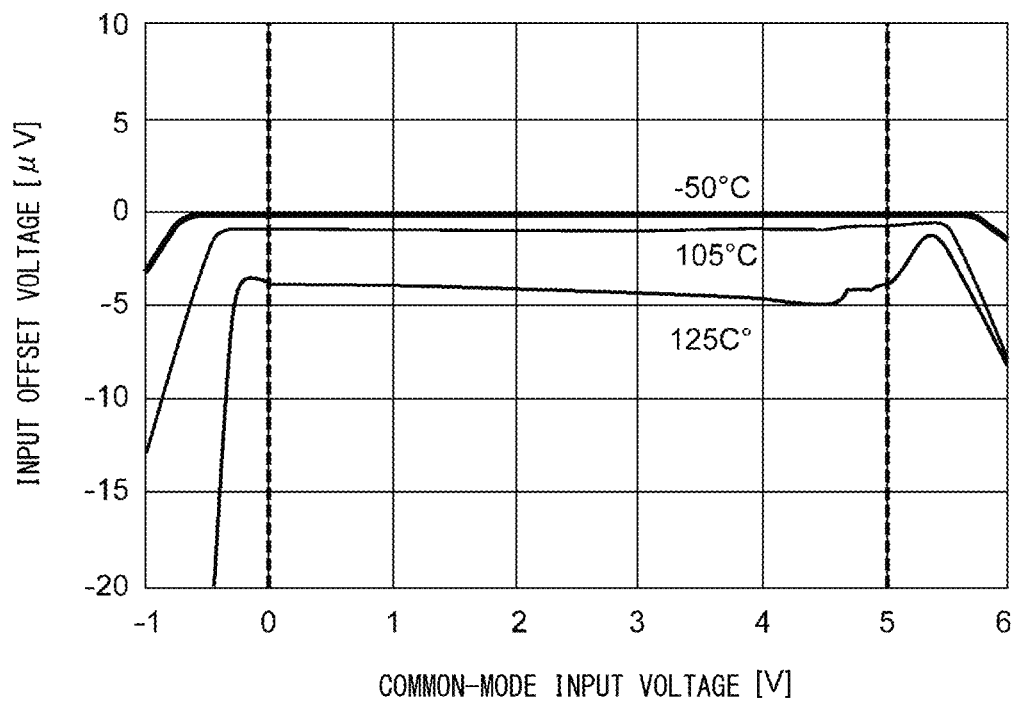
FIG. 20 is a view illustrating a relation between a common-mode input voltage and an input offset voltage of the operational amplifier of FIG. 17.

FIG. 20 is a view illustrating a relation between the common-mode input voltage and the input offset voltage. According to Example 3.1, in 0 to 5 V which is the common-mode input range, the input offset voltage is kept substantially constant.

As described above, the operational amplifier 1 according to Example 3.1 can perform a normal operation in the wide voltage range.

Example 3.2

Figure 21:
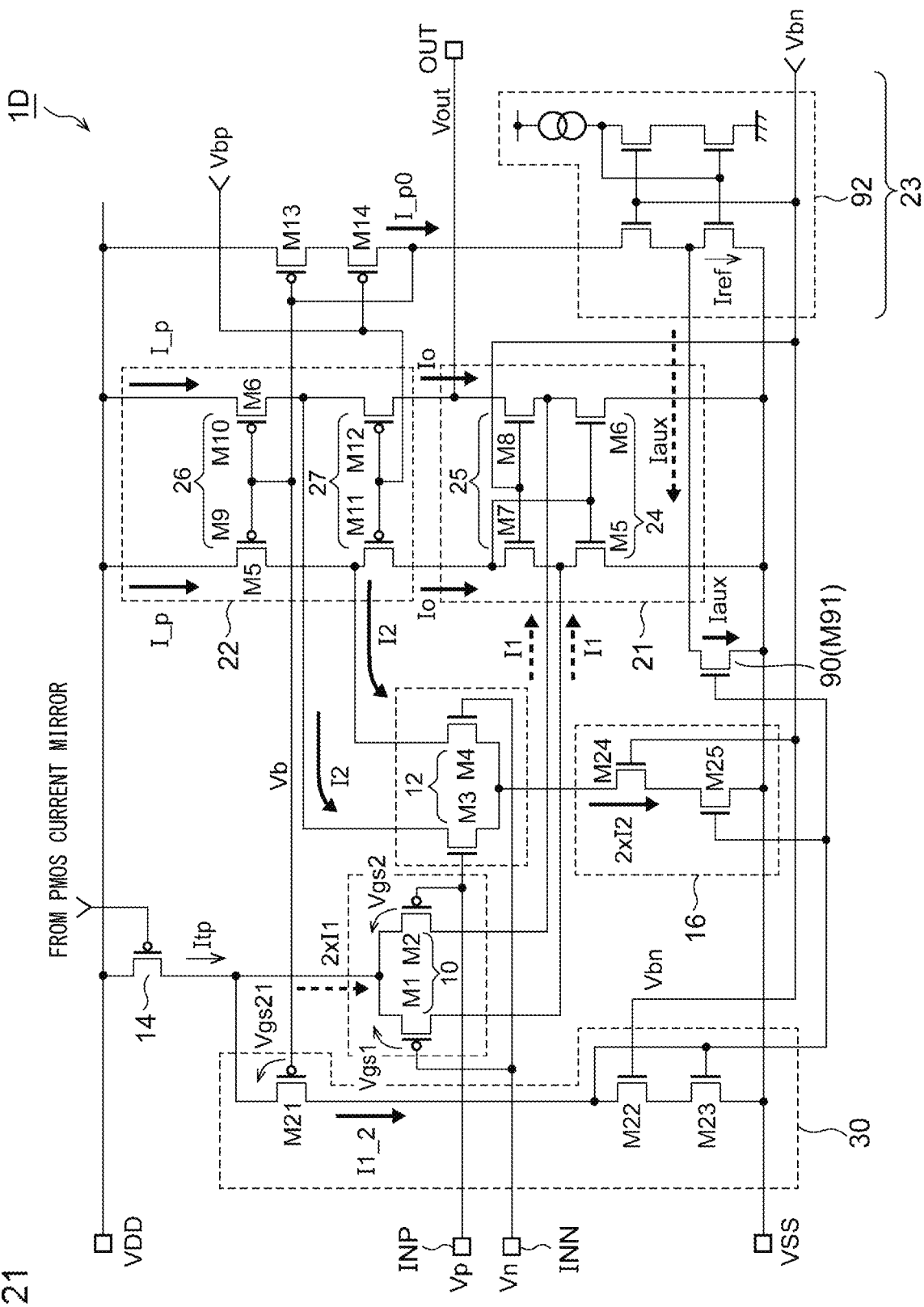
FIG. 21 is a circuit diagram of an operational amplifier according to Example 3.2.

FIG. 21 is a circuit diagram of the operational amplifier 1D according to Example 3.2. In the example, the bias current I_p0 is changed in conjunction with the state of the switching circuit 30.

The correction circuit 90 includes a transistor M91, and the current flowing through the transistor M91 is the auxiliary current Iaux. The gate of the transistor M91 is coupled to the gate of the transistor M23 of the switching circuit 30. Thus, the auxiliary current Iaux is proportional to the current I1_2 of the transistor M21 so as to be changed according to the common-mode input voltage VCM. In FIG. 21, the constant current source 92 is configured by the cascode current mirror.

Even in the operational amplifier 1D of FIG. 21, the characteristic of FIG. 19A, FIGS. 19B, and 20 can be obtained, and a normal operation can be performed in the wide voltage range. In the operational amplifier 1D of FIG. 21, the number of additional transistor elements is considerably small. Thus, the characteristic of the operational amplifier 1D can be improved with suppressing the increase of the circuit area or the energy consumption.

Modification 3.1

In the third embodiment, the current I_p generated by the second constant current circuit 26 is changed by changing the bias current Ip_0 flowing through the bias circuit 23. The invention is not limited thereto. For example, the correction circuit 90 may be configured such that the current Iaux is sourced to each of the connection nodes of the transistors M9 and M11 and the connection nodes of the transistors M10 and M12. However, in this case, there is a possibility that an additional input offset voltage is introduced when the variation is present in two systems of the sourced currents Iaux. In the method of changing the bias current Ip_0 described in the third embodiment, there is an advantage that an additional input offset voltage is not generated.

Supplementary Note 3

The following technical concept is disclosed in the third embodiment.

Item 3.1

An operational amplifier including:

an inverting input terminal structured to receive a first input voltage and a non-inverting input terminal structured to receive a second input voltage;

a first input differential pair of a first polarity structured to be coupled to the inverting input terminal and the non-inverting input terminal;

a second input differential pair of a second polarity structured to be coupled to the inverting input terminal and the non-inverting input terminal;

a first tail current source structured to supply a first tail current to the first input differential pair;

a second tail current source structured to supply a second tail current to the second input differential pair;

an output stage which is structured to convert a differential current of the first input differential pair and a differential current of the second input differential pair into an output voltage and includes a first constant current circuit turning the differential current of the first input differential pair, a first gate grounding circuit provided on a path of the first turned differential current turned by the first constant current circuit, a second constant current circuit turning the differential current of the second input differential pair, and a second gate grounding circuit provided on a path of the second turned differential current turned by the second constant current circuit; and a correction circuit structured to correct a current flowing through at least one of the first constant current circuit and the second constant current circuit according to the first input voltage and the second input voltage.

Item 3.2

The operational amplifier according to item 3.1, wherein one of the first constant current circuit and the second constant current circuit is a constant current source which generates a current proportional to a bias current, and the correction circuit changes the bias current according to the first input voltage and the second input voltage.

Item 3.3

The operational amplifier according to item 3.2, wherein the bias current is a current which is obtained by combining a predetermined reference current and an auxiliary current corresponding to the first input voltage and the second input voltage.

Item 3.4

The operational amplifier according to item 3.2 or 3.3, further including:

a switching circuit structured to dynamically changes the first tail current and the second tail current according to the first input voltage and the second input voltage.

Item 3.5

The operational amplifier according to item 3.4, wherein the bias current is in conjunction with a state of the switching circuit.

Item 3.6

The operational amplifier according to any one of items 3.2 to 3.4, wherein the correction circuit includes a constant current source which generates a constant current, a first detection transistor which has a source coupled to the constant current source and in which the first input voltage is received at a gate, a second detection transistor which has a source coupled to the constant current source and in which the second input voltage is received at a gate, and a third detection transistor which has a source coupled to the constant current source and of which a gate is biased, and the auxiliary current varies depending on a current flowing through the third detection transistor.

Fourth Embodiment

In the third embodiment, the description is given about the operational amplifier similarly with a fourth embodiment. FIG. 13 is referred again. The inventor recognizes the following problems as a result of the examination on the operational amplifier 1R of FIG. 13.

Figure 22:
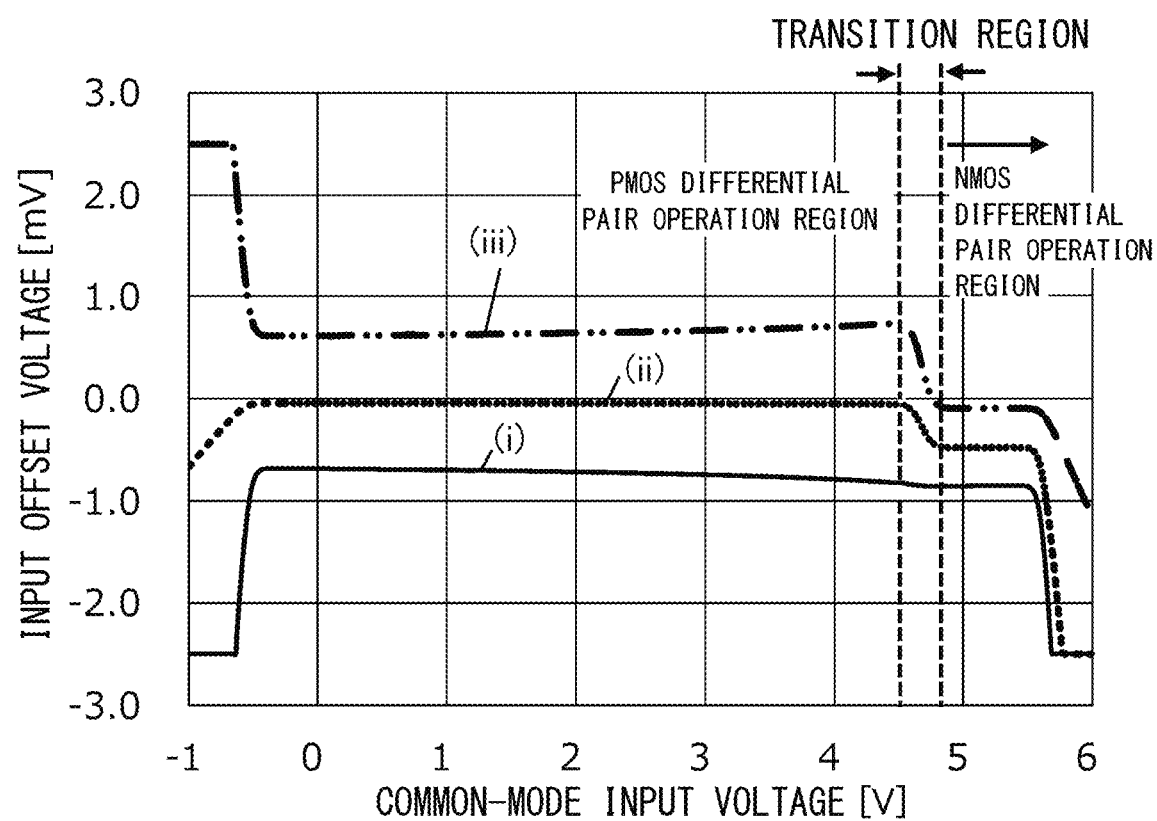
FIG. 22 is a view illustrating a relation between the input offset voltage of the operational amplifier of FIG. 13 and a common-mode input voltage VCM.

FIG. 22 is a view illustrating a relation between the input offset voltage of the operational amplifier 1R of FIG. 13 and the common-mode input voltage VCM. The characteristic (i) indicates an input offset voltage before correction. The characteristics (ii) and (iii) indicate input offset voltages after a trimming for offset correction is performed. As illustrated in the characteristic (ii), when the trimming is performed such that an input offset voltage in an operation region of the first input differential pair 10 decreases, the input offset voltage in the operation region of the second input differential pair 12 increases. As illustrated in the characteristic (iii), when the trimming is performed such that the input offset voltage in the operation region of the second input differential pair 12 decreases, the input offset voltage in the operation region of the first input differential pair 10 increases.

In the fourth embodiment, the description is given about the operational amplifier which can correct the input offset voltage in the wide voltage range.

Figure 23:
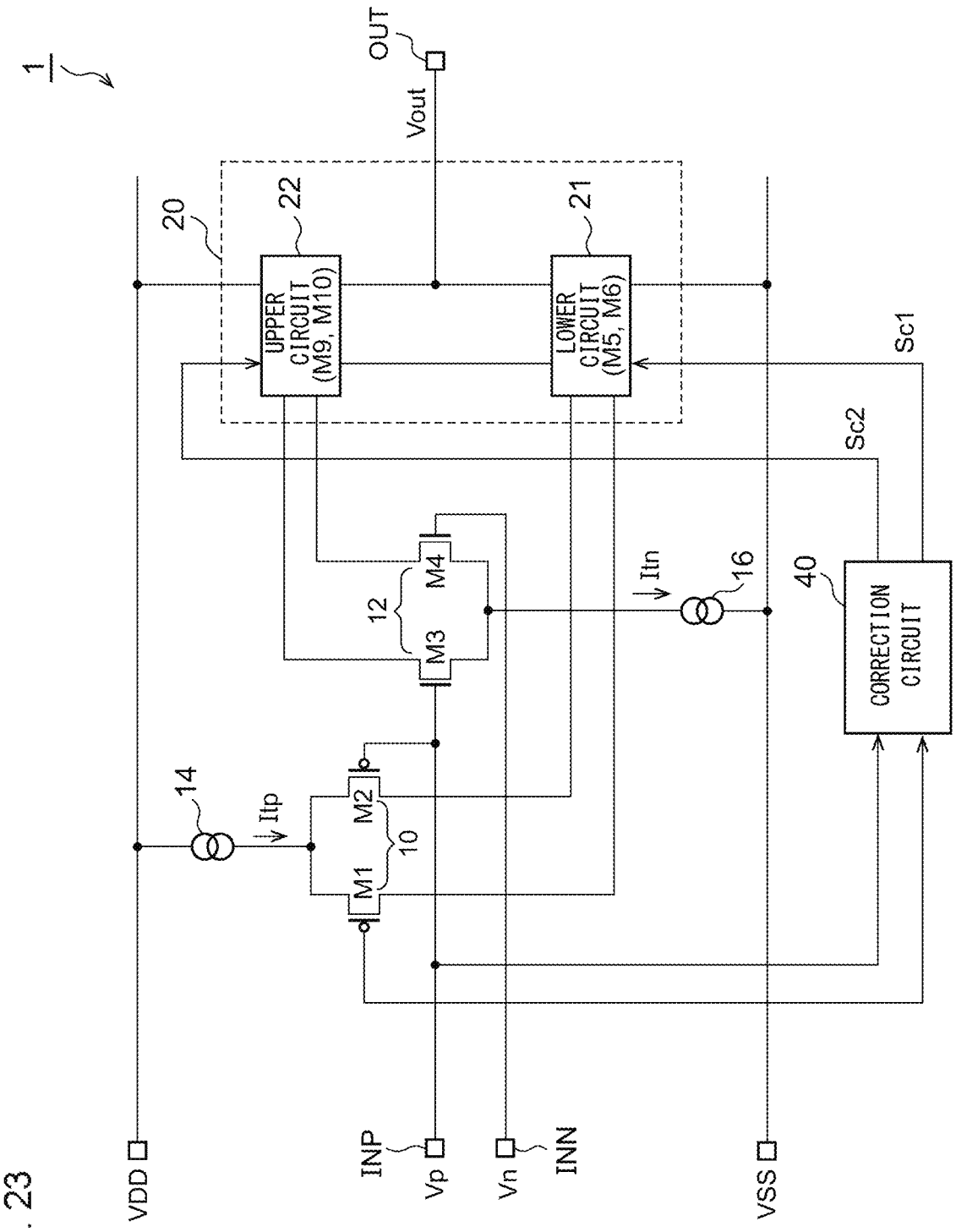
FIG. 23 is a circuit diagram of the operational amplifier according to the third embodiment.

FIG. 23 is a circuit diagram of the operational amplifier 1 according to the third embodiment. The operational amplifier 1 includes the first input differential pair 10, the second input differential pair 12, the first tail current source 14, the second tail current source 16, the output stage 20, and the correction circuit 40.

The first input voltage Vp is input to the non-inverting input terminal INP, and the second input voltage Vn is input to the inverting input terminal INN. The upper the power supply voltage is input to the upper power supply terminal $V_{DD}$, and the lower power supply voltage (for example, a grounding voltage) is supplied to the lower power supply terminal (grounding terminal) VSS. The operational amplifier 1 amplifies the difference between the first input voltage Vp and the second input voltage Vn and outputs the output voltage Vout from the output terminal OUT.

The first input differential pair 10 includes the first transistor M1 and the second transistor M2 which are PMOS transistors. The gate of the first transistor M1 is coupled to the inverting input terminal INN, and the gate of the second transistor M2 is coupled to the non-inverting input terminal INP.

The second input differential pair 12 includes the third transistor M3 and the fourth transistor M4 which are NMOS transistors. The gate of the third transistor M3 is coupled to the non-inverting input terminal INP, and the gate of the fourth transistor M4 is coupled to the inverting input terminal INN.

The first tail current source 14 supplies the first tail current Itp to the first input differential pair 10. The second tail current source 16 supplies the second tail current Itn to the second input differential pair 12.

The output stage 20 includes the upper circuit 22 and the lower circuit 21 which are stacked between the power supply line $V_{DD}$ and the grounding line VSS. The lower circuit 21 is coupled to the first input differential pair 10, and the upper circuit 22 is coupled to the second input differential pair 12. The output terminal OUT is drawn from a node inside the output stage 20. In this example, the connection nodes of the upper circuit 22 and the lower circuit 21 are OUT terminals.

The correction circuit 40 dynamically changes the state of the output stage 20 according to the first input voltage Vp and the second input voltage Vn. For example, the correction circuit 40 changes the state of the output stage 20 according to the common-mode input voltage VCM of the first input voltage Vp and the second input voltage Vn.

The correction circuit 40 adjusts the state of the lower circuit 21 and the state of the upper circuit 22 according to the first input voltage Vp and the second input voltage Vn. For example, the correction circuit 40 introduces a mismatch to a pair of transistors (transistors M5 and M6 (to be described)) included in the lower circuit 21, such that the input offset voltage is cancelled in the input voltage range (referred to as a low-voltage region) in which the operation of the first input differential pair 10 is dominant. The correction circuit 40 introduces a mismatch to a pair of transistors (transistors M9 and M10 (to be described)) included in the upper circuit 22, such that the input offset voltage is cancelled in the input voltage range (high-voltage region) in which the operation of the second input differential pair 12 is dominant.

In the input voltage range (referred to as a transition region) in which both of the first input differential pair 10 and the second input differential pair 12 are operated between the low-voltage region and the high-voltage region, the mismatch introduced to the lower circuit 21 and the mismatch introduced to the upper circuit 22 may be changed continuously and complementarily.

The correction circuit 40 introduces a mismatch to the transistor pair (M5 and M6) of the lower circuit 21 in the low-voltage region. A method of introducing a mismatch is not particularly limited thereto. However, for example, a first correction signal Sc1 may be supplied to one of the transistor pair M5 and M6. The transistor to which the first correction signal Sc1 should be supplied in the transistor pair M5 and M6 is selected according to the polarity of the input offset voltage. The first correction signal Sc1 is changed between zero and a maximum amount MAX1. The maximum amount MAX1 may be optimized (trimmed) in each of the operational amplifiers 1, such that the input offset voltage in the low-voltage region can be cancelled.

The correction circuit 40 introduces a mismatch to the transistor pair (M9 and M10) of the upper circuit 22 in the high-voltage region. For example, the correction circuit 40 may supply a second correction signal Sc2 to one of the transistor pair M9 and M10. The transistor to which the second correction signal Sc2 should be supplied in the transistor pair M9 and M10 is selected according to the polarity of the input offset voltage. The second correction signal Sc2 is changed between zero and a maximum amount MAX2. The maximum amount MAX2 may be optimized (trimmed) in each of the operational amplifiers 1, such that the input offset voltage in the high-voltage region can be cancelled.

Figure 24:
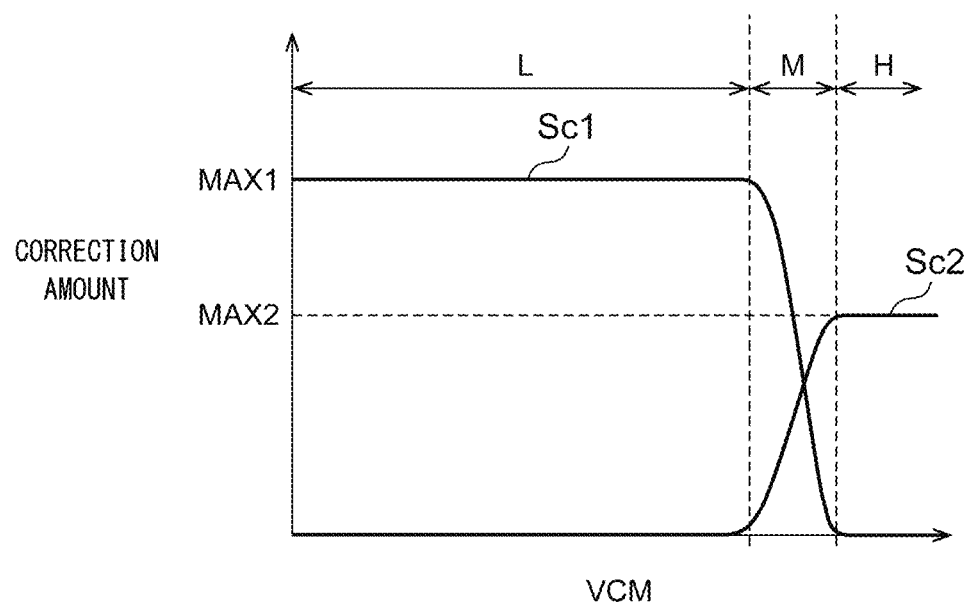
FIG. 24 is a view for describing an operation of the operational amplifier of FIG. 23.

FIG. 24 is a view for describing the operation of the operational amplifier 1 of FIG. 23. A horizontal axis indicates the common-mode input voltage VCM, and a vertical axis indicates the amount (correction amount) of the mismatch introduced to each of the lower circuit 21 and the upper circuit 22. In the low-voltage region L in which the first input differential pair 10 is dominant, the first correction signal Sc1 becomes the maximum amount MAX1, and the second correction signal Sc2 becomes a minimum value (for example, zero). On the contrary, in the high-voltage region H in which the second input differential pair 12 is dominant, the second correction signal Sc2 becomes the maximum amount MAX2, and the first correction signal Sc1 becomes the minimum value (for example, zero). In the transition region M, the low-voltage region L and the high-voltage region H can be coupled seamlessly by continuously changing the first correction signal Sc1 and the second correction signal Sc2 according to the common-mode input voltage VCM.

The above description has been made about the basic configuration of the operational amplifier 1. The invention encompasses various kinds of apparatuses and methods that can be perceived as a block diagram or a circuit diagram of FIG. 23 or that can be derived from the above-described description and is not limited to a specific configuration. Hereinafter, specific configuration examples or examples will be described so as not to be intended to restrict the scope of the invention but to ease and clarify understanding of the essence of the invention and the operation.

Example 4.1

Figure 25:
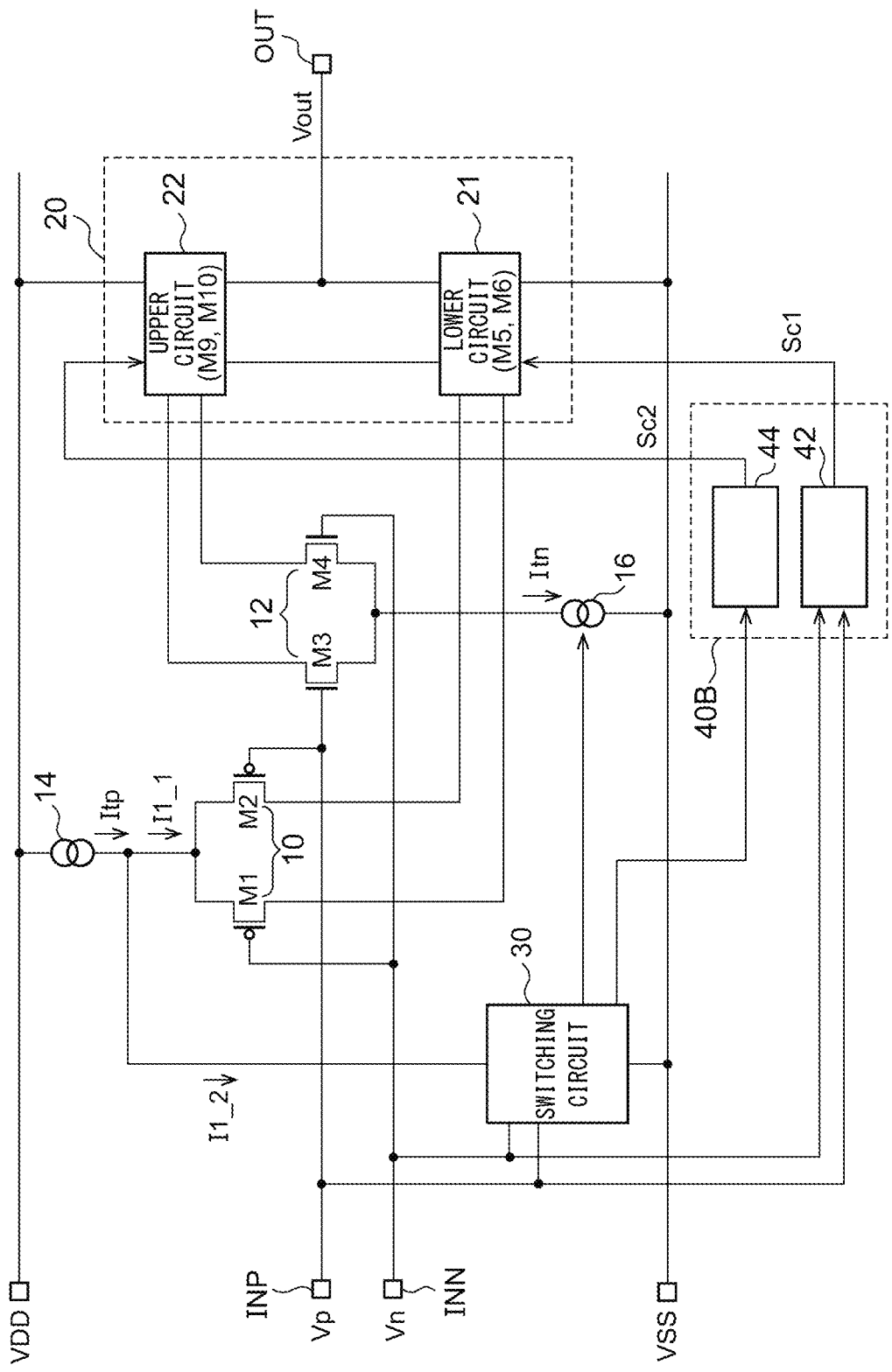
FIG. 25 is a circuit diagram of an operational amplifier according to Example 4.1.

FIG. 25 is a circuit diagram of the operational amplifier 1A according to Example 4.1. The operational amplifier 1A includes the switching circuit 30. The switching circuit 30 dynamically changes the first tail current Itp and the second tail current Itn according to the first input voltage Vp and the second input voltage Vn. Specifically, the second tail current Itn is substantially zero in the above-described low-voltage region, and the first tail current Itp is substantially zero in the high-voltage region. In the transition region, the switching circuit 30 may continuously change the first tail current Itp and the second tail current Itn according to the common-mode input voltage VCM to seamlessly connect the high-voltage range and the low-voltage region.

The first tail current source 14 generates the first tail current Itp. The switching circuit 30 sinks the current amount I1_2 corresponding to the common-mode input voltage VCM of the first input voltage Vp and the second input voltage Vn. Therefore, the amount of the tail current supplied to the first input differential pair 10 becomes Itp−I1_2.

The sink current I1_2 is substantially zero in the low-voltage region and may be equal to the tail current amount Itp in the high-voltage range. In addition, in the transition region, the sink current I1_2 may increase as the common-mode input voltage VCM increases.

The second tail current source 16 is coupled to the switching circuit 30 and generates the second tail current Itn in conjunction with the state of the switching circuit 30, that is, the sink current I1_2. The second tail current Itn is substantially zero in the low-voltage region and is a predetermined amount in the high-voltage range. In addition, in the transition region, the second tail current Itn may increase as the common-mode input voltage VCM increases.

The correction circuit 40 includes a first corrector 42 and a second corrector 44. The first corrector 42 introduces a mismatch to the transistor pair (M5 and M6) of the lower circuit 21. The first corrector 42 may receive the input voltages Vp and Vn to generate the first correction signal Sc1 on the basis of the common-mode input voltage VCM thereof.

The second corrector 44 introduces a mismatch to the transistor pair M9 and M10 of the upper circuit 22. The second corrector 44 is coupled to the switching circuit 30 and generates the second correction signal Sc2 according to the state of the switching circuit 30. For example, the state of the switching circuit 30 may be the amount of the sink current I1_2 or the voltage of the internal node of the switching circuit 30.

Figure 26:
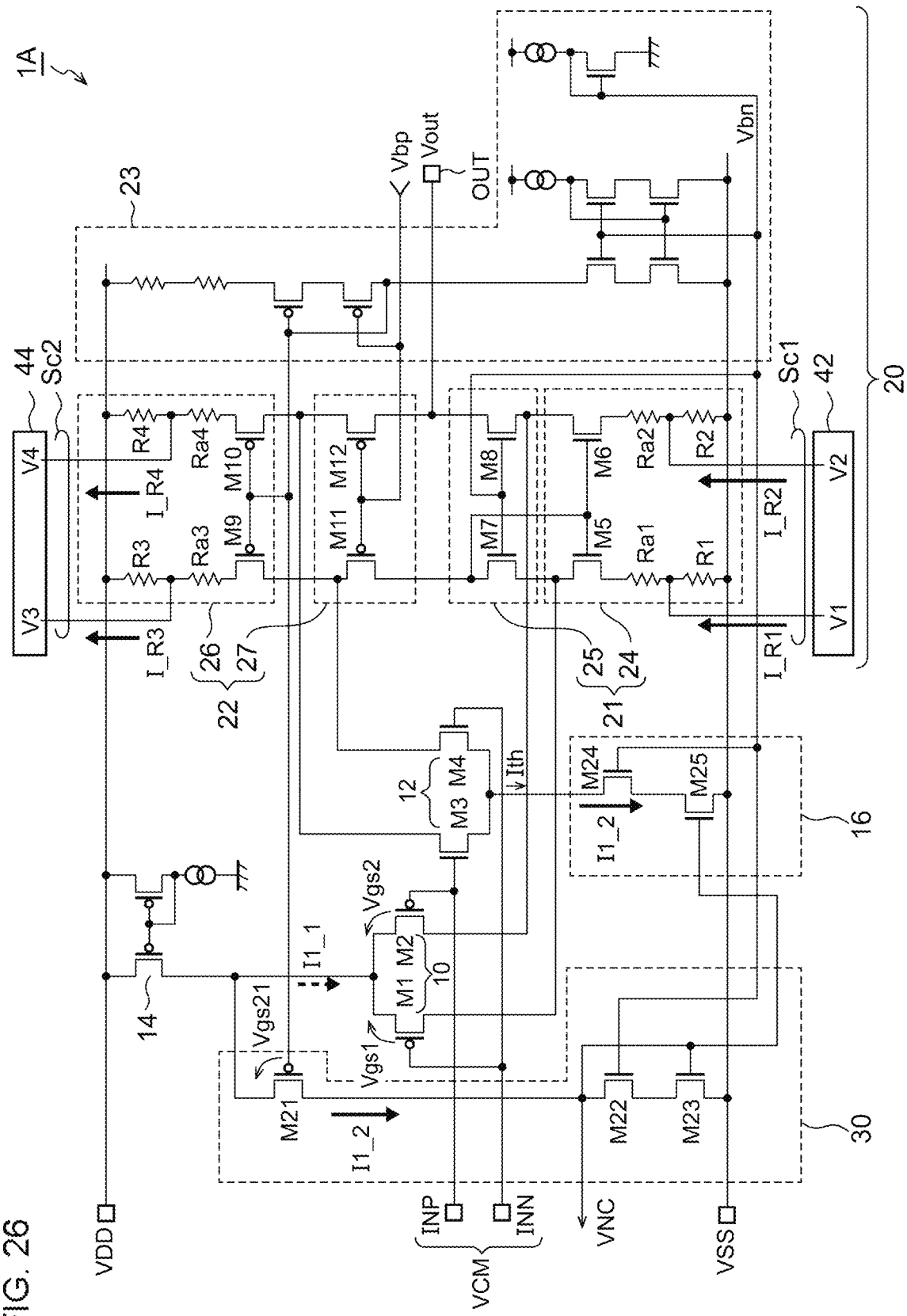
FIG. 26 is a circuit diagram illustrating a specific configuration example of the operational amplifier of FIG. 25.

FIG. 26 is a circuit diagram illustrating a specific configuration example of the operational amplifier 1A of FIG. 25. The switching circuit 30 includes the transistor M21, M22, and M23. The transistor M21 is a P-channel MOSFET. The source thereof is coupled to the first tail current source 14, and the bias voltage Vb generated by the output stage 20 is supplied to the gate thereof. The sink current I1_2 flowing through the transistor M21 is changed according to the common-mode input voltage VCM.

The second tail current source 16 includes the transistors M24 and M25. The transistors M24 and M25 form the current mirror together with the transistors M22 and M23.

The sink current I1_2 is copied and turned to be supplied as the second tail current Itn to the second input differential pair 12.

The operational amplifier 1A of FIG. 26 is a folded-cascode operational amplifier. The lower circuit 21 includes the first constant current circuit 24 and the first gate grounding circuit 25. The first constant current circuit 24 turns the differential current of the first input differential pair 10. The first gate grounding circuit 25 is provided on the path of the turned differential current (referred to as a first turned differential current). The upper circuit 22 functions as an active load with respect to the first turned differential current and converts the first turned differential current into the output voltage Vout.

The upper circuit 22 includes the second constant current circuit 26 and the second gate grounding circuit 27. The second constant current circuit 26 turns the differential current of the second input differential pair 12. The second gate grounding circuit 27 is provided on the path of the turned differential current. The lower circuit 21 functions as an active load with respect to the second turned differential current and converts the second turned differential current into the output voltage Vout.

The transistors M9 and M10 of the second constant current circuit 26 are biased by the bias circuit 23 and function as a constant current source. The transistors M5 and M6 of the first constant current circuit 24 are current mirrors in which the transistor M5 side is an input side, and the M6 side is an output side. Similarly, the transistors M5 and M6 function as constant current sources.

In FIG. 26, the first correction signal Sc1 and the second correction signal Sc2 are current signals. The first constant current circuit 24 includes the transistor pair M5 and M6 and source resistors R1 and R2 coupled to the sources thereof. The first corrector 42 sources correction currents I_R1 and I_R2 to one of the source resistors R1 and R2 to introduce a mismatch to the transistor pair M5 and M6. resistor pair Ra1 and Ra2 is inserted between the transistor pair M5 and M6 and the resistor pair R1 and R2. The correction amount of the input offset voltage can be controlled by three parameters of the resistor pair Ra1 and Ra2, the amount of the current signal, and the resistor pair R1 and R2.

Similarly, the upper circuit 22 includes the transistor pair M9 and M10 and source resistors R3 and R4 coupled to the sources thereof. The second corrector 44 sinks correction currents I_R3 and I_R4 from one of the source resistors R3 and R4 so as to introduce a mismatch to the transistor pair M9 and M10. Resistor pair Ra3 and Ra4 is inserted between the transistor pair M9 and M10 and the resistor pair R3 and R4. The correction amount of the input offset voltage can be controlled by three parameters of the resistor pair Ra3 and Ra4, the amount of the current signal, and the resistor pair R3 and R4.

Figure 27:
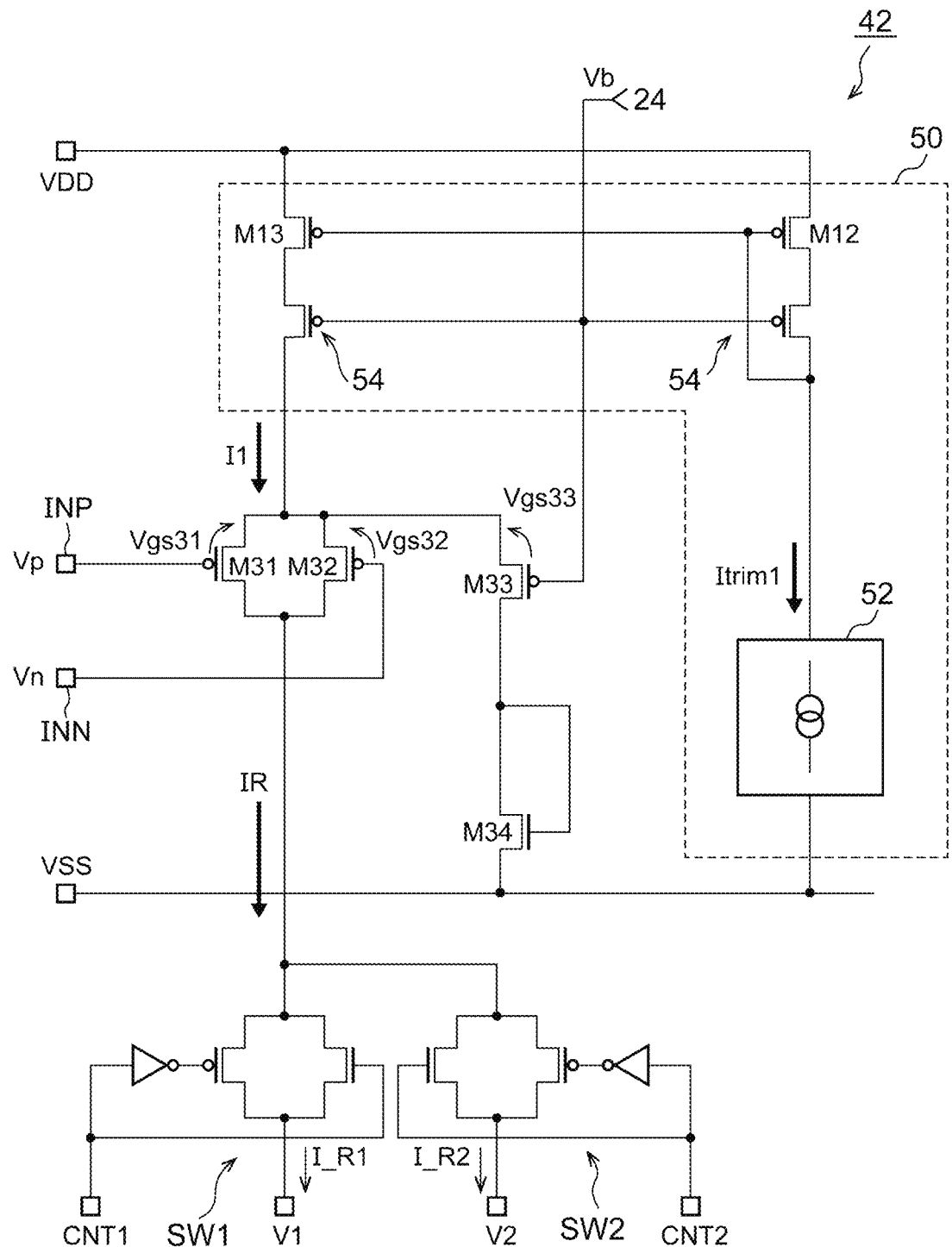
FIG. 27 is a circuit diagram illustrating a configuration example of a first corrector.

FIG. 27 is a circuit diagram illustrating the configuration example of the first corrector 42. The first corrector 42 mainly includes a first current source 50, a first detection transistor M31, a second detection transistor M32, a third detection transistor M33, a first switch SW1, and a second switch SW2. The first current source 50 generates the first current I1. The first current source 50 includes a trimmable current source 52 which generates the constant current Itrim1 and a current mirror circuit 54 which copies and turns the constant current Itrim1 and outputs the first current I1.

The current amount of the constant current Itrim1 generated by the current source 52 is determined in an inspection process of the operational amplifier 1A. Specifically, assuming that VCM=Vp=Vn, the operational amplifier 1A is operated in the low-voltage region, and the input offset voltage at this time is measured. The constant current Itrim1 is determined such that the input offset voltage is close to zero. The constant current Itrim1 corresponds to the above-described maximum amount MAX1.

In the first detection transistor M31 to the third detection transistor M33, the sources are commonly coupled to each other. In addition, the drains of the first detection transistor M31 and the second detection transistor M32 are commonly coupled to each other. The first input voltage Vp is input to the gate of the first detection transistor M31, and the second input voltage Vn is input to the gate of the second detection transistor M32. The proper bias voltage Vb is applied to the gate of the third detection transistor M33. As the bias voltage Vb, the bias voltage Vb generated by the upper circuit 22 of FIG. 26 can be used. The transistor M34 (or another load) is provided between the drain of the third detection transistor M33 and the grounding terminal VSS.

The first switch SW1 is turned on when a control signal CNT1 is high, and the second switch SW2 is turned on when the control signal CNT2 is high. The current flowing through the first detection transistor M31 and the second detection transistor M32 is set as IR. When the first switch SW1 is turned on, and the second switch SW2 is turned off, the current IR is supplied to the resistor R1 of the lower circuit 21. On the contrary, when the first switch SW1 is turned off, and the second switch SW2 is turned on, the current IR is supplied to the resistor R2 of the lower circuit 21.

Among Vgs31 and Vgs32, the voltage of the higher one is expressed as Vgs. In a state where the common-mode input voltage VCM is sufficiently low compared to the bias voltage Vb (Vgs33<Vgs), all the first current I1 flows to the transistors M31 and M32, and the current IR increases. When the common-mode input voltage VCM increases to about the bias voltage Vb, that is, Vgs33≈Vgs, the current starts to flow through the transistor M33, and the current IR starts to decrease. When the common-mode input voltage VCM is higher than the bias voltage Vb, that is, Vgs33>Vgs, the current IR is further decrease to zero.

According to the first corrector 42 of FIG. 27, the maximum amount is prescribed by the constant current Itrim1, and a first correction current Ic1 of which the current amount is dynamically changed according to the common-mode input voltage VCM can be generated.

Figure 28A:
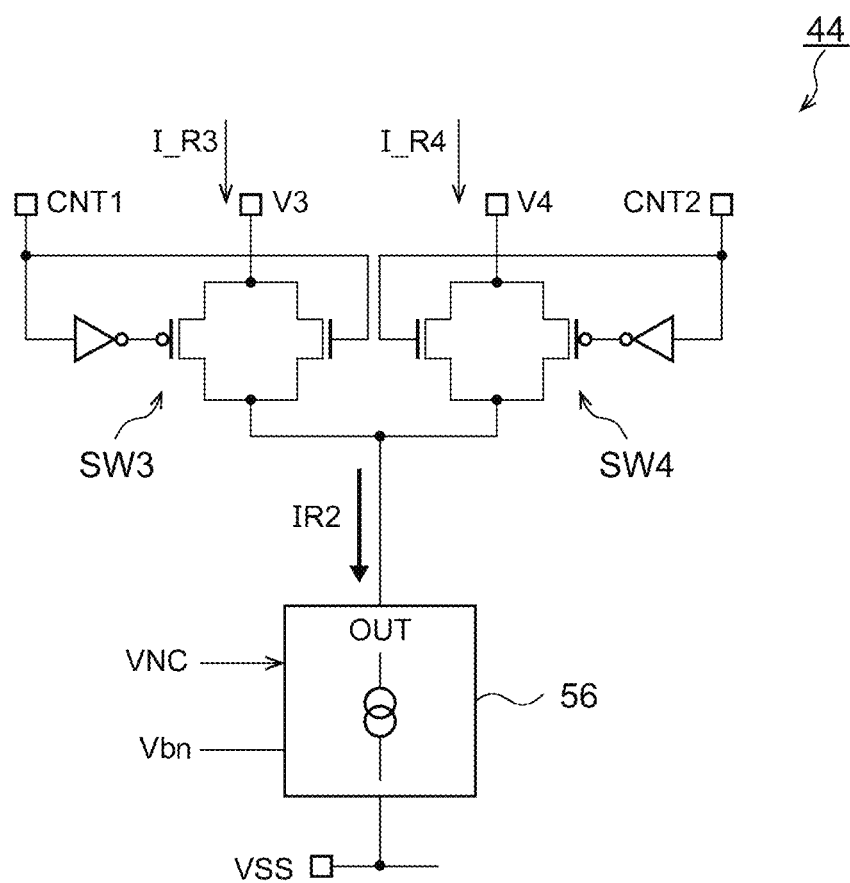
FIG. 28A and FIG. 28B are circuit diagrams illustrating a configuration example of a second corrector.
Figure 28B:
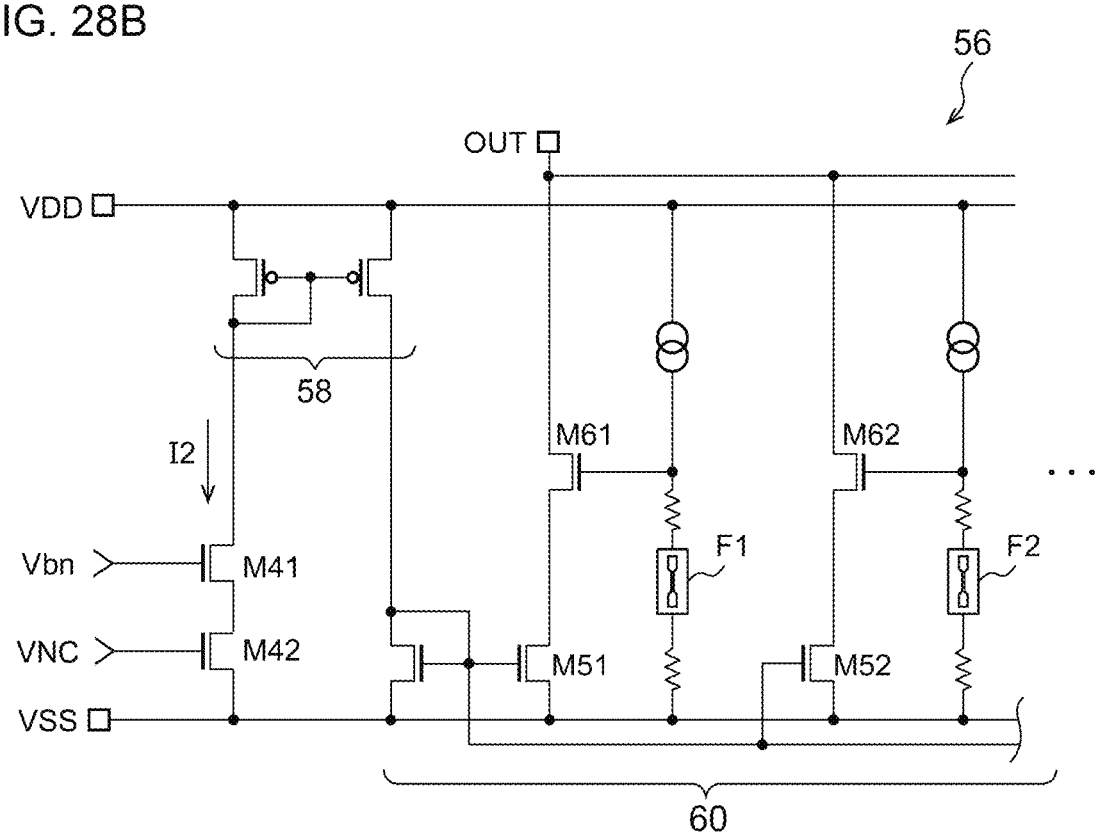

FIG. 28A and FIG. 28B are circuit diagrams illustrating the configuration example of the second corrector 44. With reference to FIG. 28A, the second corrector 44 includes a second current source 56, a third switch SW3, and a fourth switch SW4. The third switch SW3 and the fourth switch SW4 are turned on complementarily according to the control signals CNT1 and CNT2. In the second current source 56, the maximum amount can be set according to the trimming. The second current source 56 is configured to be able to generate the correction current IR2 which is changed between zero and the maximum amount according to the state of the switching circuit 30.

FIG. 28B is referred again. The transistors M41 and M42 are coupled to the transistors M22 and M23 of the switching circuit 30 and form the current mirror circuit. The current $I_2$ flowing through the transistor M41 varies depending on the sink current I1_2 flowing through the switching circuit 30 and increases with increase of the common-mode input voltage VCM.

The current mirror circuit 58 turns the current $I_2$ of the transistor M41. The current mirror circuit 60 is configured such that the mirror ratio K is changeable and sinks the second correction current Ic2=I2'×K from the OUT terminal. The sizes of a plurality of transistors M51, M52, and so on may be binary-weighted.

The current mirror circuit 58 includes a plurality of fuses F1, F2, and so on and a plurality of transistors M61, M62, and so on. The mirror ratio K can be changed according to whether a plurality of fuses F1, F2, and so on are each fused or not. Specifically, when the i-th fuse F1 is fused, the corresponding transistor M6i is turned off, and the current path is blocked.

According to the second corrector 44 of FIG. 28A and FIG. 28B, when the current I2 of which the current amount is dynamically changed according to the common-mode input voltage VCM is amplified at the mirror ratio K corresponding to the trimming, a proper offset can be introduced to the transistor pair M5 and M6 of the upper circuit 22.

Figure 29:
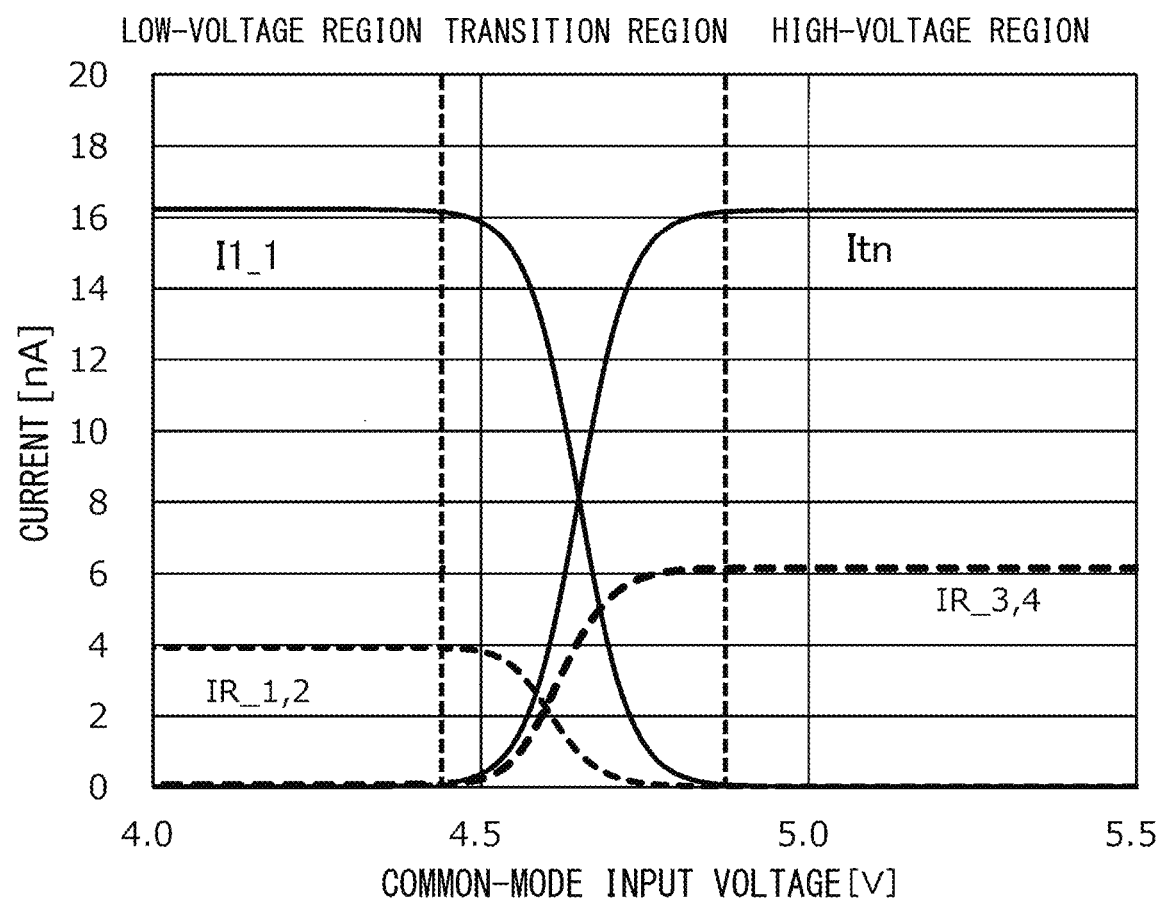
FIG. 29 is a view for describing an operation of the operational amplifier of FIG. 25.

FIG. 29 is a view for describing the operation of the operational amplifier 1A of FIG. 25. The horizontal axis indicates the common-mode input voltage. FIG. 29 illustrates the first tail current I1_1, the second tail current I1_2, the first correction current I_R1 and R2, and the second correction current I_R3 and R4.

Figure 30:
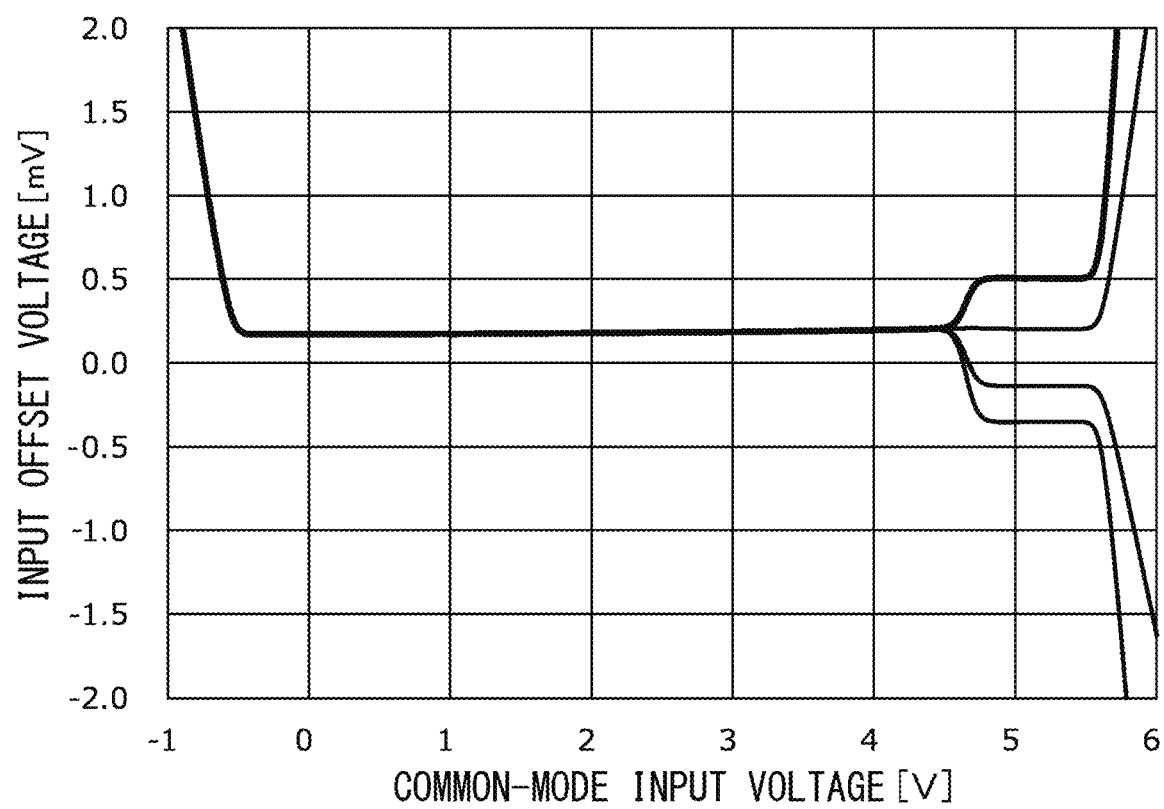
FIG. 30 is a view illustrating a relation between a common-mode input voltage and an input offset voltage in the operational amplifier of FIG. 25.

FIG. 30 is a view illustrating a relation between the common-mode input voltage and the input offset voltage in the operational amplifier 1A of FIG. 25.

FIG. 30 illustrates a plurality of characteristics in which the mirror ratio K of the current mirror circuit 60 of FIG. 28B is set as a parameter. These characteristics indicate the characteristic before the first corrector 42 is optimized, and thus the input offset voltage in the low-voltage region is not zero. As understood from FIG. 30, the adjustment of the input offset voltage in the high-voltage region is not affected by the input offset voltage in the low-voltage range. Therefore, the input offset voltages of the high-voltage region and the low-voltage region can be optimized independently, and both thereof can come close to zero.

Modification 4.1

Figure 31:
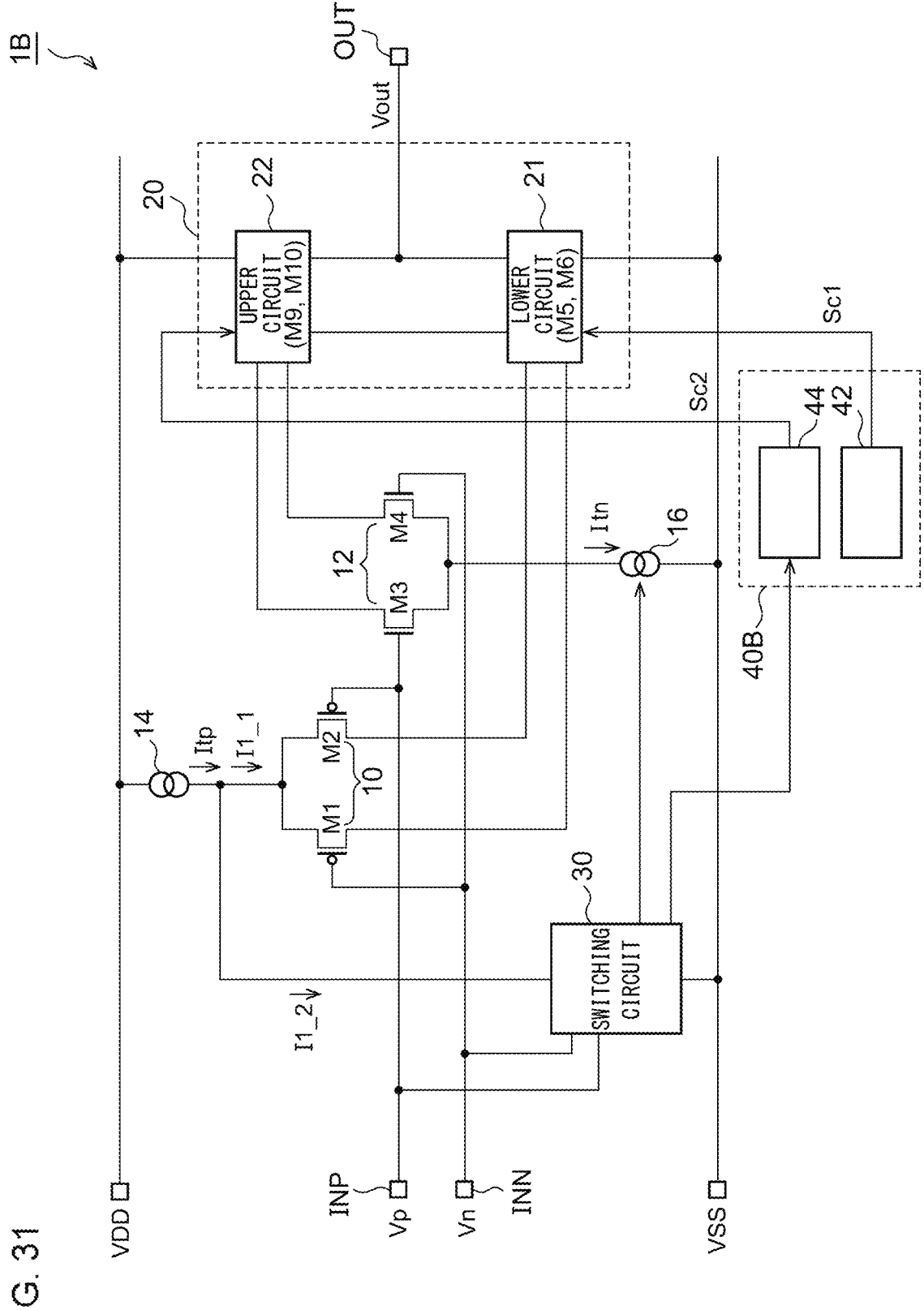
FIG. 31 is a circuit diagram of an operational amplifier according to Modification 4.1.

FIG. 31 is a circuit diagram of an operational amplifier 1B according to Modification 4.1. The difference from the operational amplifier 1A of FIG. 25 will be described about the configuration and the operation of the operational amplifier 1B. In the operational amplifier 1A of FIG. 25, the first correction signal Sc1 is changed according to the common-mode input voltage VCM. On the other hand, in the operational amplifier 1B of FIG. 31, the first correction signal Sc1 generated by a first corrector 42B of a correction circuit 40B is constant without depending on the common-mode input voltage VCM.

Figure 32:
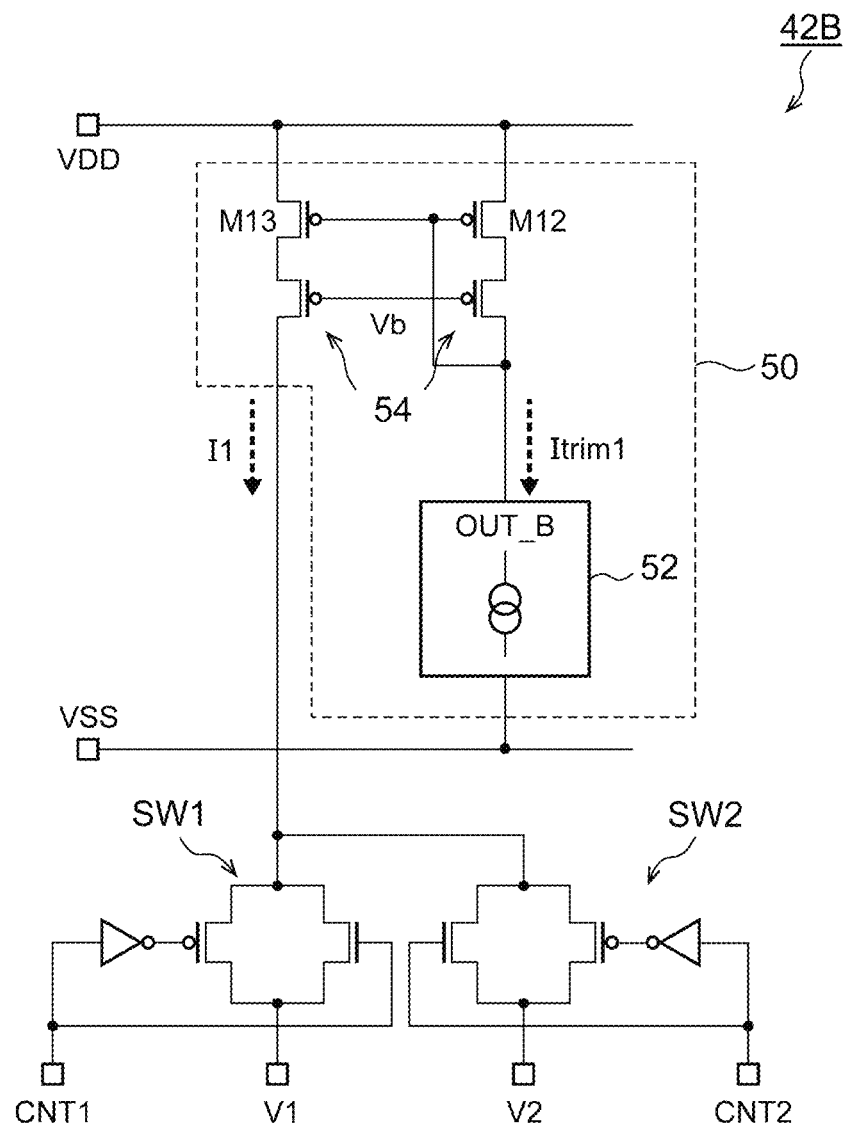
FIG. 32 is a circuit diagram of the first corrector.

FIG. 32 is a circuit diagram of the first corrector 42B. From the first corrector 42 of FIG. 27, the first corrector 42B is perceived as a configuration in which the transistors M31 to M34 are omitted, and the output current I1 of the current mirror circuit 54 becomes the correction current IR.

Figure 33:
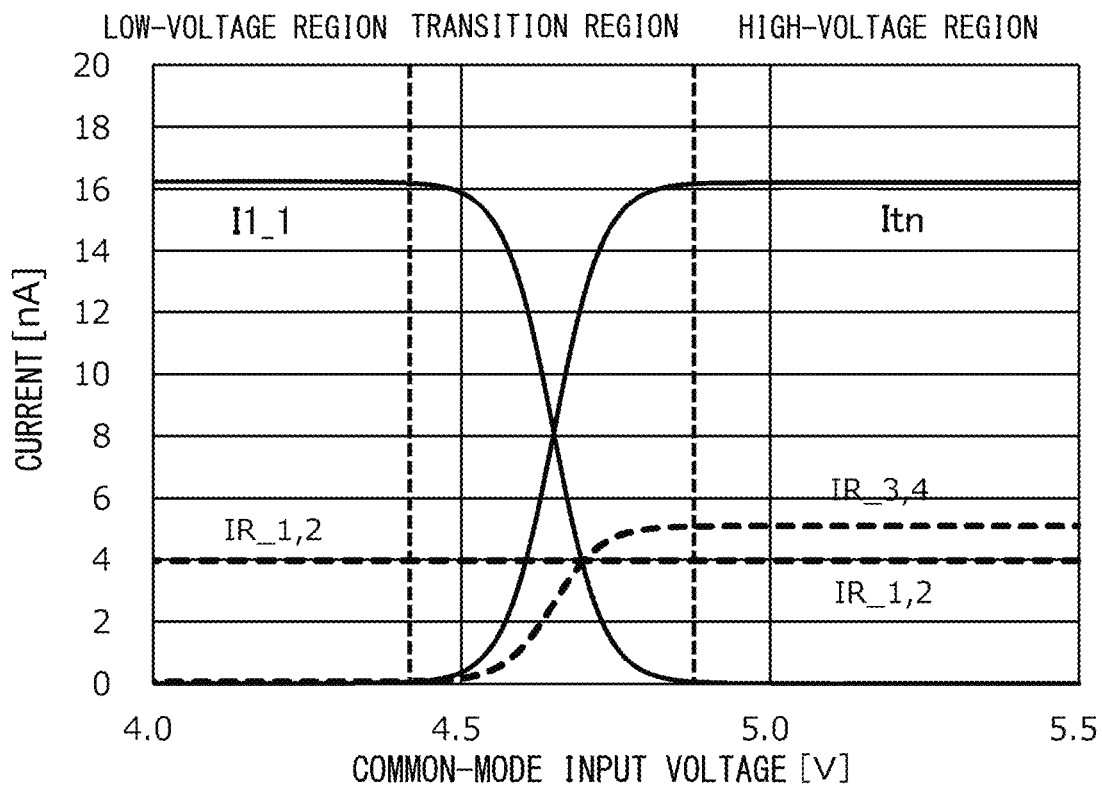
FIG. 33 is a view for describing an operation of the operational amplifier of FIG. 31.

FIG. 33 is a view for describing the operation of the operational amplifier 1B of FIG. 31. The horizontal axis indicates the common-mode input voltage. FIG. 33 illustrates the first tail current I1_1, the second tail current I1_2, the first correction currents I_R1 and R2, the second correction currents I_R3 and R4.

Figure 34:
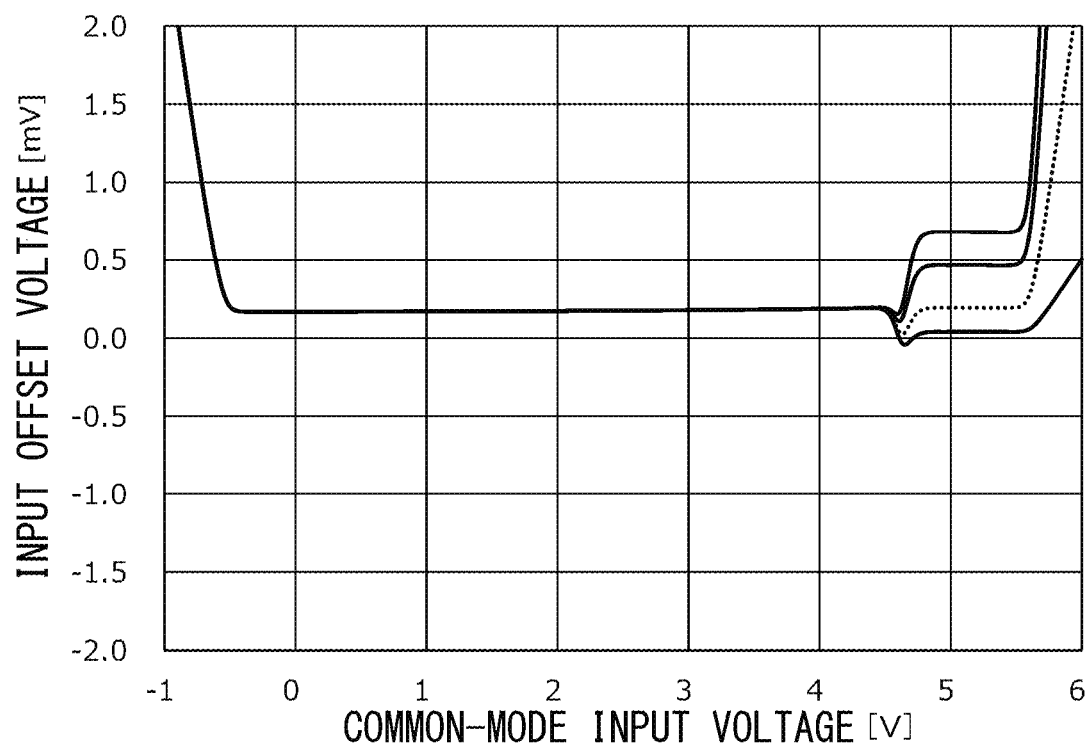
FIG. 34 is a view illustrating a relation between a common-mode input voltage and an input offset voltage in the operational amplifier of FIG. 31.

FIG. 34 is a view illustrating a relation between the common-mode input voltage and the input offset voltage in the operational amplifier 1B of FIG. 31. FIG. 30 illustrates a plurality of characteristics in which the mirror ratio K of the current mirror circuit 60 of FIG. 28B is set as a parameter. These characteristics indicate the characteristic before the first corrector 42 is optimized, and thus the input offset voltage in the low-voltage region is not zero. Also in Modification 4.1, the adjustment of the input offset voltage in the high-voltage region is not affected by the input offset voltage in the low-voltage range. Therefore, the input offset voltages of the high-voltage region and the low-voltage region can be optimized independently, and both thereof can come close to zero.

However, in Modification 4.1, as illustrated by a broken line in FIG. 34, when the input offset voltage of the high-voltage region is equal to that of the low-voltage region, a dip (or a peak) which is not completely compensated may remain in the transition region. Therefore, in Modification 4.1, the circuit area can be reduced in exchange for the sacrifice of the compensation capability of the input offset voltage compared to Example 4.1. On the contrary, according to Example 4.1, the input offset voltage of flat zero can be achieved in the common-mode input voltage range also including the transition region.

Modification 4.2

In Modification 4.1, with the first correction current constant, the second correction current is dynamically changed according to the common-mode input voltage.

However, the invention is not limited thereto. On the contrary, with the second correction current constant, the first correction current may be changed dynamically according to the common-mode input voltage.

Modification 4.3

Figure 35:
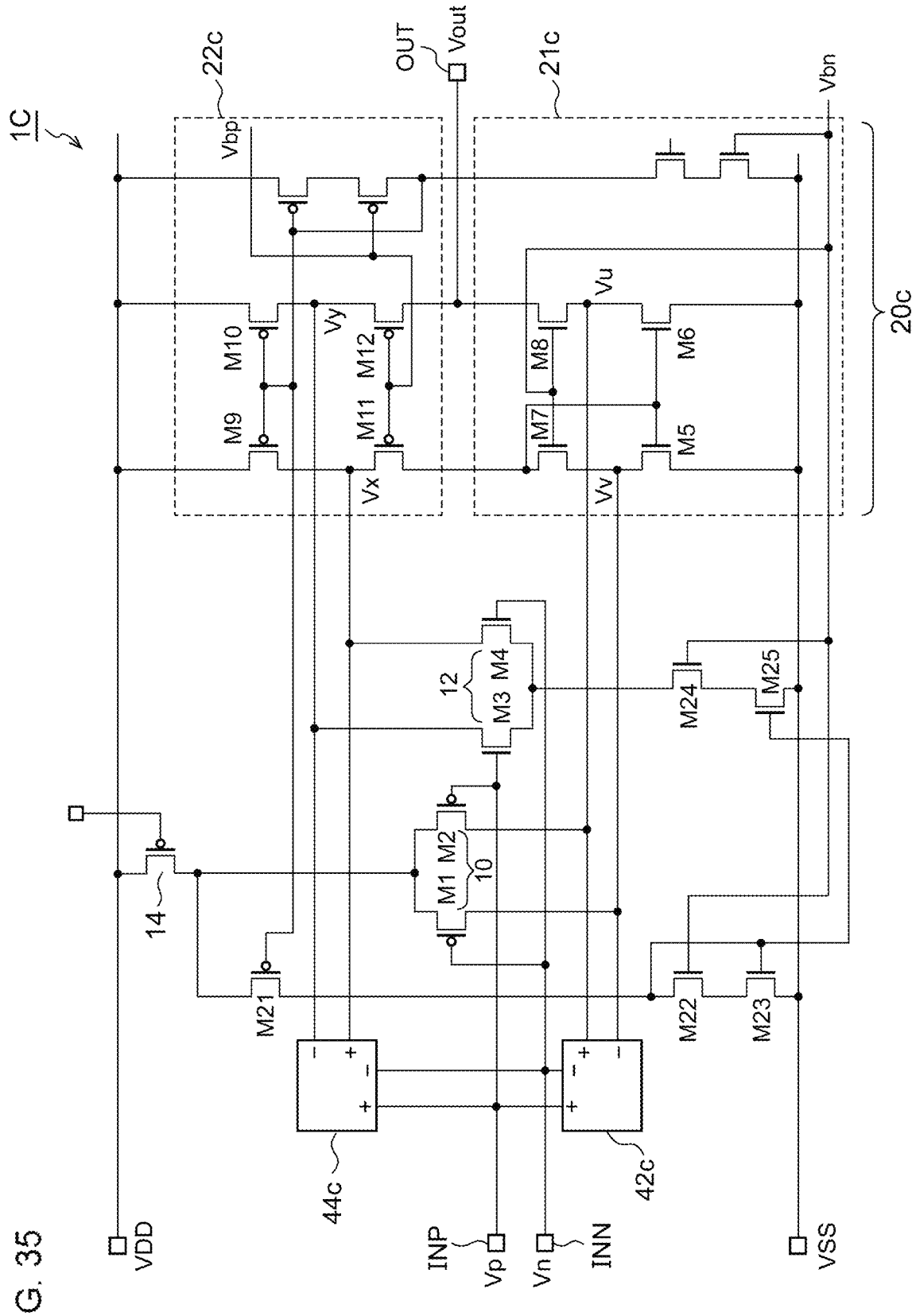
FIG. 35 is a circuit diagram of an operational amplifier according to Modification 4.3.

An operational amplifier 1C according to Modification 4.3 is described with reference to FIG. 35 to FIG. 37. FIG. 35 is a circuit diagram of the operational amplifier 1C according to Modification 4.3. The description will be given about the difference between the operational amplifier 1C of FIG. 35 and the operational amplifier 1A of FIG. 26. A first corrector 42C changes voltages Vu and Vv of respective drains of the transistors M6 and M5 of a lower circuit 21C. A second corrector 44C changes voltages Vx and Vy of respective drains of the transistors M9 and M10 of an upper circuit 22C.

Figure 36A:
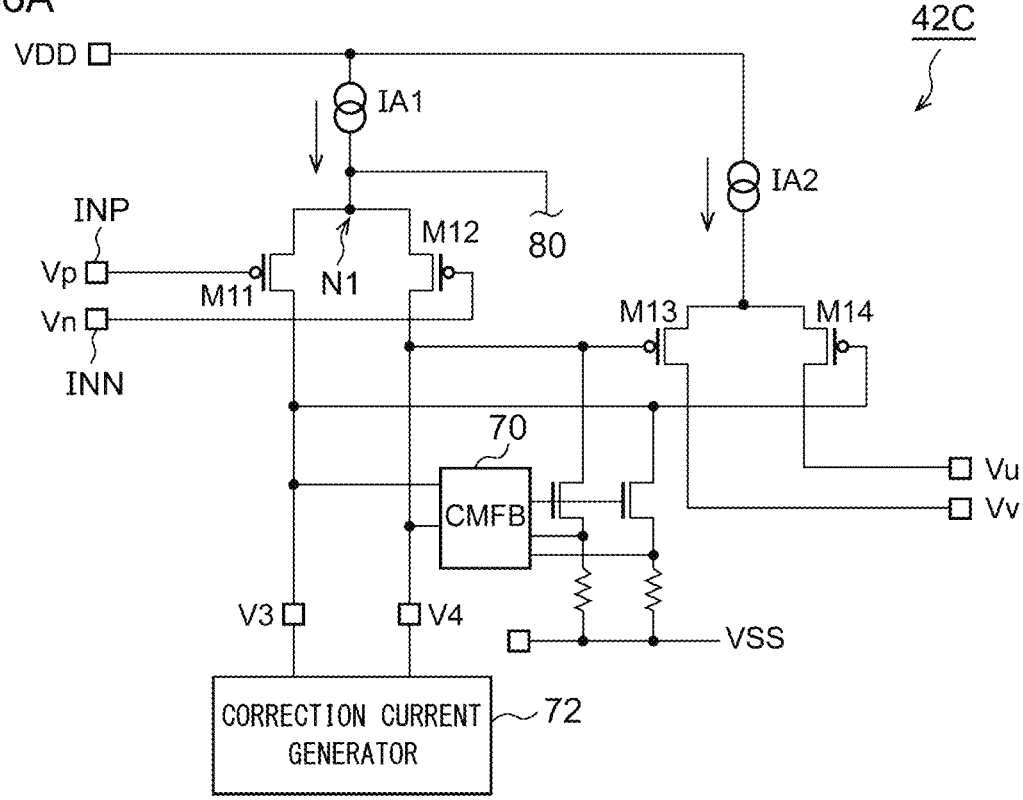
FIG. 36A and FIG. 36B are circuit diagrams of the first corrector and the second corrector of FIG. 35.
Figure 36B:
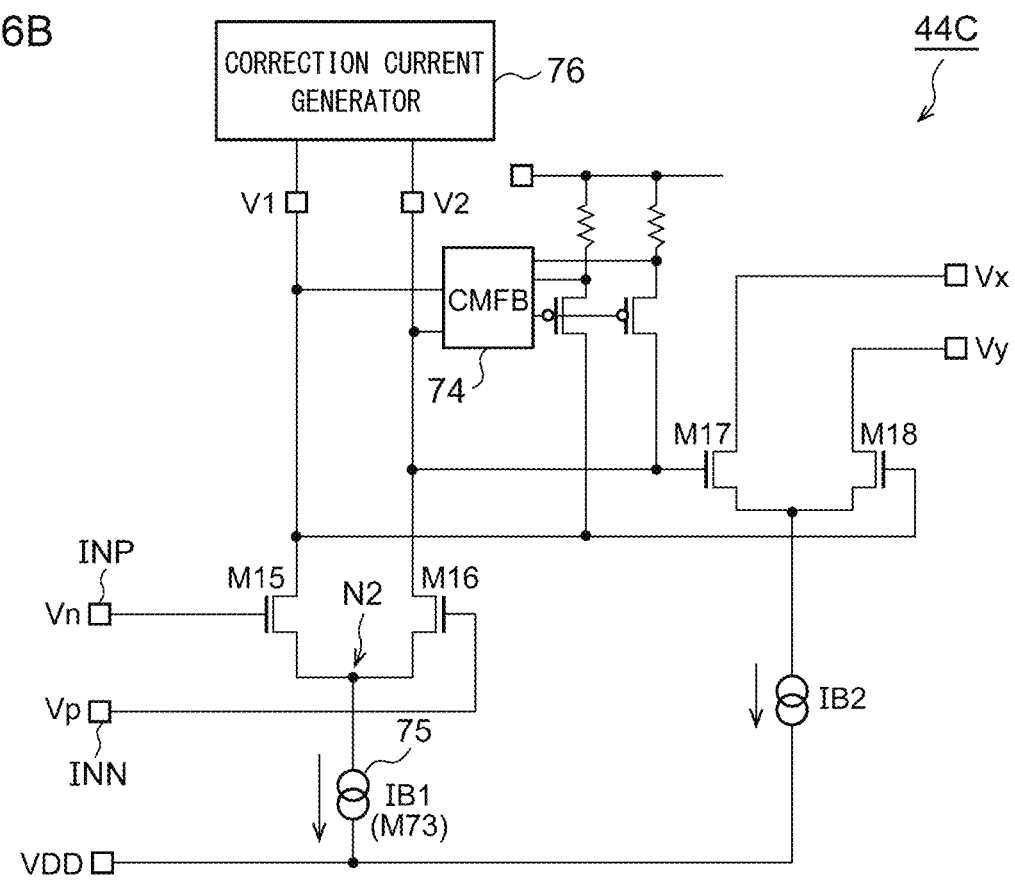

FIG. 36A and FIG. 36B are circuit diagrams of the first corrector 42C and the second corrector 44C of FIG. 35. The first corrector 42C includes the transistors M11 to M14, a common-mode feedback circuit 70, and a correction current generator 72. The common-mode feedback circuit 70 fixes the drains of the transistors M11 and M12 in a common-mode voltage, so as to prevent the saturation of the transistors M13 and M14.

The correction current generator 72 sinks a trimmable current from one of nodes V3 and V4. The amount of the sink current is controlled such that the offset voltage is close to zero. For example, the correction current generator 72 can be configured to be similar with the second corrector 44 of FIG. 28A. The drains of the transistors M13 and M14 are coupled to the drains of the transistors M6 and M5 of FIG. 35.

The second corrector 44C includes transistors M15 to M18, a common-mode feedback circuit 74, and a correction current generator 76. The common-mode feedback circuit 74 fixes the drains of the transistors M15 and M16 in a common-mode voltage, so as to prevent the saturation of the transistors M17 and M18.

The correction current generator 76 sources a trimmable current to one of the nodes V1 and V2. The amount of the source current is controlled such that the offset voltage is close to zero. For example, the correction current generator 76 can be configured to be similar with the first corrector 42 of FIG. 27 or the first corrector 42B of FIG. 32. The drains of the transistors M17 and M18 are coupled to the drains of the transistors M9 and M10 of FIG. 35.

Figure 37:
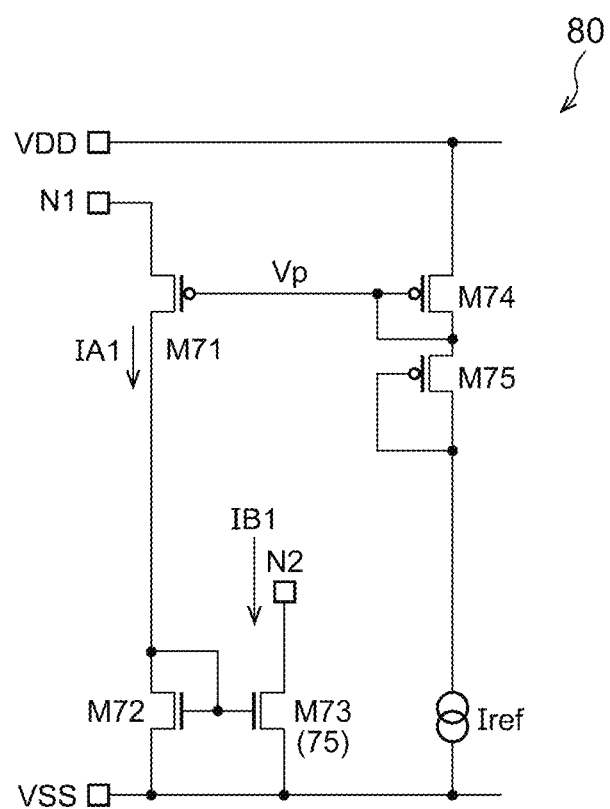
FIG. 37 is a circuit diagram of a switching circuit.

FIG. 37 is a circuit diagram of a switching circuit 80. The switching circuit 80 switches the operations of the first corrector 42C of FIG. 36A and the second corrector 44C of FIG. 36B. The switching circuit 80 includes transistors M71 to M75. The basic configuration and operation of the switching circuit 80 are similar with those of the switching circuit 30 of FIG. 26.

The source of the transistor M71 is coupled to the node N1 of FIG. 36A. When the common-mode input voltage VCM is low, the current flowing through the transistor M71 is zero, and the tail current IA1 flows through the transistors M11 and M12 of FIG. 36A. When the common-mode input voltage VCM increases, the current flowing through the transistor M71 increases, the tail currents of the transistors M11 and M12 of FIG. 36A are reduced, and the first corrector 42C is turned off.

A transistor M73 corresponds to the tail current source 75 of the transistors M15 and M16 of FIG. 36B. When the common-mode input voltage VCM is low, the current flowing through the transistor M71 is zero, and thus the tail current IB1 is also zero. When the common-mode input voltage VCM increases, the current flowing through the transistor M71 increases, the tail current IB1 increases, the tail currents of the transistors M15 and M16 of FIG. 36B are reduced, and the second corrector 44C is turned on.

Supplementary Note 4

The following technical concept is disclosed in the fourth embodiment.

Item 4.1

An operational amplifier including:

an inverting input terminal structured to receive a first input voltage and a non-inverting input terminal structured to receive a second input voltage;

a first input differential pair of a first polarity structured to be coupled to the inverting input terminal and the non-inverting input terminal;

a second input differential pair of a second polarity structured to be coupled to the inverting input terminal and the non-inverting input terminal;

a first tail current source structured to supply a first tail current to the first input differential pair;

a second tail current source structured to supply a second tail current to the second input differential pair;

an output stage structured to convert a differential current flowing through the first input differential pair and a differential current flowing through the second input differential pair into an output voltage; and a correction circuit structured to dynamically change a state of the output stage according to the first input voltage and the second input voltage.

Item 4.2

The operational amplifier according to item 4.1, wherein the output stage includes an upper circuit and a lower circuit which are stacked between a power supply line and a grounding line, and the correction circuit controls a state of the lower circuit when the first input differential pair is active and controls a state of the upper circuit when the second input differential pair is active.

Item 4.3

The operational amplifier according to item 4.1 or 4.2, wherein the output stage includes a first constant current circuit which turns a differential current of the first input differential pair, a first gate grounding circuit which is provided on a path of the differential current turned by the first constant current circuit, a second constant current circuit which turns a differential current of the second input differential pair, and a second gate grounding circuit which is provided on a path of the differential current turned by the second constant current circuit, and the correction circuit adjusts states of the first constant current circuit and the second constant current circuit according to the first input voltage and the second input voltage.

Item 4.4

The operational amplifier according to item 4.3, wherein the correction circuit includes a first corrector which supplies a first correction current to the first constant current circuit, and a second corrector which supplies a second correction current to the second constant current circuit.

Item 4.5

The operational amplifier according to item 4.4, wherein the first corrector includes a first current source which generates a first reference current, a first transistor in which the first input voltage is input to a gate, and a second transistor which is provided in parallel with the first transistor and in which the second input voltage is input to a gate, and the first correction current varies depending on currents flowing through the first transistor and the second transistor.

Item 4.6

The operational amplifier according to any one of items 4.1 to 4.5, the amplifier further including:

a switching circuit structured to dynamically change the first tail current and the second tail current according to the first input voltage and the second input voltage.

Item 4.7

The operational amplifier according to item 4.6, wherein the correction circuit controls the state of the output stage in conjunction with a state of the switching circuit.

Item 4.8

An operational amplifier including:

an inverting input terminal structured to receive a first input voltage and a non-inverting input terminal structured to receive a second input voltage;

a first input differential pair structured to be coupled to the inverting input terminal and the non-inverting input terminal;

a second input differential pair structured to be coupled to the inverting input terminal and the non-inverting input terminal;

a first tail current source structured to supply a first tail current to the first input differential pair;

a second tail current source structured to supply a second tail current to the second input differential pair;

a switching circuit structured to dynamically change the first tail current and the second tail current according to the first input voltage and the second input voltage;

an output stage which includes a lower circuit coupled to the first input differential pair and an upper circuit coupled to the second input differential pair; and a correction circuit structured to supply a first correction current corresponding to the first input voltage and the second input voltage to the lower circuit and supply a second correction current corresponding to a state of the switching circuit to the upper circuit.

Item 4.9

An operational amplifier including:

an inverting input terminal structured to receive a first input voltage and a non-inverting input terminal structured to receive a second input voltage;

a first input differential pair structured to be coupled to the inverting input terminal and the non-inverting input terminal;

a second input differential pair structured to be coupled to the inverting input terminal and the non-inverting input terminal;

a first tail current source structured to supply a first tail current to the first input differential pair;

a second tail current source structured to supply a second tail current to the second input differential pair;

a switching circuit structured to dynamically change the first tail current and the second tail current according to the first input voltage and the second input voltage;

a first constant current circuit structured to turn a differential current of the first input differential pair;

a first gate grounding circuit which is provided on a path of the differential current turned by the first constant current circuit;

a second constant current circuit structured to turn a differential current of the second input differential pair;

a second gate grounding circuit which is provided on a path of the differential current turned by the second constant current circuit; and a correction circuit structured to supply a first correction current and a second correction current to the first constant current circuit and the second constant current circuit in conjunction with the switching circuit.

While the preferred embodiments of the present invention have been described using specific terms, such description is for illustrative purposes only, and it is to be understood that changes and variations may be made without departing from the spirit or scope of the appended claims.

What is claimed is:

1. A reference current source comprising:
a first transistor and a second transistor having control terminals coupled to each other;
a current mirror circuit structured to supply a current having the same amount as that of a current flowing through a first path including the second transistor to a second path including the first transistor and supply a current having a predetermined number of times of a current amount of the current of the first path to a third path separate from the second path;
a third transistor which is provided on the third path and has a source coupled to one end of the first transistor;
a fourth transistor which is provided on a low potential side from the third transistor on the third path and has a gate coupled commonly with a gate of the third transistor; and
a resistor which is provided between a source of the fourth transistor and one end of the second transistor.

2. The reference current source according to claim 1, wherein
the third transistor and the fourth transistor are operated in a subthreshold region.

3. The reference current source according to claim 1, further comprising
a fifth transistor which is provided on a low potential side from the fourth transistor on the third path, wherein
a voltage of a control terminal of the fifth transistor is supplied to the gates of the third transistor and the fourth transistor.

4. The reference current source according to claim 1, wherein
the current mirror circuit includes:
a sixth transistor which is coupled to the first transistor;
a seventh transistor which is coupled to the second transistor; and
an eighth transistor which is coupled to the third path.

5. The reference current source according to claim 1, wherein
the first transistor and the second transistor are the same in size.

6. The reference current source according to claim 1, wherein
the first transistor and the second transistor are field effect transistors (FET).

7. The reference current source according to claim 1, wherein the first transistor and the second transistor are bipolar transistors.

8. The reference current source according to claim 1, further comprising
an activation circuit, wherein
the activation circuit includes:
a first circuit which is provided between a power supply line and a grounding line and supplies a second current corresponding to a first current to the reference current source while the first current flows from the power supply line to the grounding line during activation;
a second circuit which acts on the first circuit such that the second current becomes zero when a third current corresponding to the second current flows; and
a capacitor which is charged by a fourth current corresponding to the second current, and
the first circuit is configured such that the first current flowing through the first circuit is blocked when a voltage of the capacitor increases.

9. The reference current source according to claim 1, further comprising
an activation circuit, wherein
the activation circuit includes:
a capacitor having a first end grounded;
a first transistor having a gate grounded;
a second transistor having a source grounded and a gate and a drain coupled to a drain of the first transistor;
a third transistor having a source grounded, a gate coupled to the gate of the second transistor, and a drain coupled to a gate and a drain of a transistor of the reference current source;
a fourth transistor which has a source coupled to a power supply line and a drain coupled to the source of the first transistor and in which a voltage of a second end of the capacitor is applied to a gate;
a fifth transistor having a source coupled to the power supply line and a gate coupled to the gate and the drain of the transistor of the reference current source;
a sixth transistor having a source grounded and a gate and a drain coupled to each other;
a seventh transistor having a source grounded, a gate coupled to the gate of the sixth transistor, and a drain coupled to the drain of the second transistor;
an eighth transistor which has a source coupled to the drain of the fifth transistor and a drain coupled to the drain of the sixth transistor and in which the voltage of the second end of the capacitor is applied to a gate; and
a ninth transistor having a source coupled to the power supply line, a gate coupled to the gate and the drain of the transistor of the reference current source, and a drain coupled to the second end of the capacitor.

10. A semiconductor device comprising:
the reference current source according to claim 1.

11. A reference current source comprising:
a first transistor and a second transistor having control terminals coupled to each other;
a current mirror circuit structured to supply a current having the same amount as that of a current flowing through a first path including the second transistor to a second path including the first transistor and supply a current having a predetermined number of times of a current amount of the current of the first path to a third path separate from the second path; and
a plurality of MOS transistors which are provided in series on the third path and has respective gates coupled commonly, wherein
one end of the first transistor is coupled to one end of one of the plurality of MOS transistors, and one end of the second transistor is coupled through a resistor with one end of another one of the plurality of MOS transistors.

* * * * *